(12) United States Patent
Shen et al.

(10) Patent No.: US 7,617,442 B2
(45) Date of Patent: Nov. 10, 2009

(54) EFFICIENT CONSTRUCTION OF LDPC (LOW DENSITY PARITY CHECK) CODES WITH CORRESPONDING PARITY CHECK MATRIX HAVING CSI (CYCLIC SHIFTED IDENTITY) SUB-MATRICES

(75) Inventors: Ba-Zhong Shen, Irvine, CA (US); Tak K. Lee, Irvine, CA (US); Kelly Brian Cameron, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 708 days.

(21) Appl. No.: 11/472,256

(22) Filed: Jun. 21, 2006

(65) Prior Publication Data

US 2007/0033497 A1 Feb. 8, 2007

Related U.S. Application Data

(60) Provisional application No. 60/700,127, filed on Jul. 18, 2005, provisional application No. 60/708,937, filed on Aug. 17, 2005, provisional application No. 60/716,868, filed on Sep. 14, 2005, provisional application No. 60/721,599, filed on Sep. 29, 2005, provisional application No. 60/728,250, filed on Oct. 19, 2005.

(51) Int. Cl.
*G06F 11/00* (2006.01)
*H03M 13/03* (2006.01)

(52) U.S. Cl. ........................ 714/801; 714/784

(58) Field of Classification Search .............. 714/784, 714/800–801, 807
See application file for complete search history.

(56) References Cited

U.S. PATENT DOCUMENTS

| 3,542,756 | A  | 11/1970 | Gallager       |
|-----------|----|---------|----------------|
| 3,665,396 | A  |  5/1972 | Forney, Jr.    |
| 4,295,218 | A  | 10/1981 | Tanner         |
| 6,430,233 | B1 |  8/2002 | Dillon et al.  |
| 6,473,010 | B1 | 10/2002 | Vityaev et al. |
| 6,567,465 | B2 |  5/2003 | Goldstein et al. |

(Continued)

OTHER PUBLICATIONS

Kim et al., Overlapped decoding for a class of quasi-cyclic LDPC codes, 2004, IEEE, p. 113-117.*

(Continued)

*Primary Examiner*—Shelly A Chase
(74) *Attorney, Agent, or Firm*—Garlick Harrison & Markison; Shayne X. Short

(57) ABSTRACT

Efficient construction of LDPC (Low Density Parity Check) codes with corresponding parity check matrix having CSI (Cyclic Shifted Identity) sub-matrices. These constructed LDPC codes can be implemented in multiple-input-multiple-output (MIMO) communication systems. One LDPC code construction approach uses CSI sub-matrix shift values whose shift values are checked instead of non-zero element positions within the parity check matrix (or its corresponding sub-matrices). When designing an LDPC code, this approach is efficient to find and avoid cycles (or loops) in the LDPC code's corresponding bipartite graph. Another approach involves GRS (Generalized Reed-Solomon) code based LDPC code construction. These LDPC codes can be implemented in a wide variety of communication devices, including those implemented in wireless communication systems that comply with the recommendation practices and standards being developed by the IEEE 802.11n Task Group (i.e., the Task Group that is working to develop a standard for 802.11 TGn (High Throughput)).

20 Claims, 13 Drawing Sheets

U.S. PATENT DOCUMENTS

| | | |
|---|---|---|
| 6,633,856 B2 | 10/2003 | Richardson et al. |
| 7,246,304 B2 | 7/2007 | Kim |

OTHER PUBLICATIONS

Zhong et al., Block LDPC: a practical LDPC coding system design approach, 2004, IEEE, p. 1 to 10.*

R. G. Gallager, "Low density parity check codes," IRE Trans. Info. Theory, vol. IT-8, Jan. 1962, pp. 21-28.

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47. No. 2, Feb. 2001, pp. 599-618.

Marc P. C. Fossorier, "Quasi-Cyclic Low-Density Parity-Check Codes From Circulant Permutation Matrices," IEEE Trans. Inform. Theory, vol. 50. No. 8, Aug. 2004, pp. 1788-1793.

I. Djurdjevic, J. Xu., K. Abdel-Ghaffar, and S. Lin, "A Class of Low-Density Parity-Check Codes Constructed Based on Reed-Solomon Codes with Two Information Symbols," IEEE Communications Letters, vol. 7, No, 7, Jul. 2003, pp. 317-319.

J. Campello, D. S. Modha, and S. Rajagopalan, "Designing LDPC Codes Using Bit-Filling," ICC 2001, 2001 IEEE International Conference on Communications, vol. 1 of 10, Jun. 2001, pp. 55-59.

T. J. Richardson, and R. L. Urbanke. "The Capacity of Low-Density Parity-Check Codes Under Message-Passing Decoding," IEEE Transactions on Information Theory, vol. 47, No. 2, Feb. 2001, pp. 599-618.

F. J. MacWilliams, "The Theory of Error-Correcting Codes" 1997, North-Holland Mathematical Library, pp. 300-305.

Lei Chen, "Construction of Quasi-Cyclic LDPC Codes Based on the Minimum Weight Codewords of Reed-Solomon Codes" International Symposium, IEEE, Jun. 2004, pp. 239.

Shu Lin, "Structured Low-Density Parity-Check Codes: Algebraic Constructions" Jul. 2004, pp. 1-67.

Amin Shokrollahi, "LDPC Codes: An Introduction" Internet Article, Apr. 2003, pp. 1-34.

J. I. Hall, "Notes on Coding Theory," Dept. of Mathematics, Michigan State University, East Lansing, MI 48824 USA, Jan. 3, 2003—"Chapter 5: Generalized Reed-Solomon Codes" Internet Article, Jan. 3, 2003, pp. 63-76.

H. Zhong, and T. Zhang, "Block-LDPC: A Practical LDPC Coding System Design Approach," IEEE Transactions on Circuits and Systems, vol. 52, No. 4, Apr. 2005, pp. 766-775.

Sang-Min Kim, and K. K. Parhi "Overlapped Decoding For A Class Of Quasi-Cyclic LDPC Codes," IEEE 2004, pp. 113-117.

* cited by examiner

EFFICIENT CONSTRUCTION OF LDPC (LOW DENSITY PARITY CHECK) CODES WITH CORRESPONDING PARITY CHECK MATRIX HAVING CSI (CYCLIC SHIFTED IDENTITY) SUB-MATRICES

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/700,127, entitled "Algebraic construction of LDPC (Low Density Parity Check) codes with corresponding parity check matrix having CSI (Cyclic Shifted Identity) sub-matrices," filed Monday, Jul. 18, 2005.

2. U.S. Provisional Application Ser. No. 60/708,937, entitled "Algebraic construction of LDPC (Low Density Parity Check) codes with corresponding parity check matrix having CSI (Cyclic Shifted Identity) sub-matrices," filed Wednesday, Aug. 17, 2005.

3. U.S. Provisional Application Ser. No. 60/716,868, entitled "Algebraic construction of LDPC (Low Density Parity Check) codes with corresponding parity check matrix having CSI (Cyclic Shifted Identity) sub-matrices," filed Wednesday, Sep. 14, 2005.

4. U.S. Provisional Application Ser. No. 60/721,599, entitled "Algebraic construction of LDPC (Low Density Parity Check) codes with corresponding parity check matrix having CSI (Cyclic Shifted Identity) sub-matrices," filed Thursday, Sep. 29, 2005.

5. U.S. Provisional Application Ser. No. 60/728,250, entitled "Efficient construction of LDPC (Low Density Parity Check) codes with corresponding parity check matrix having CSI (Cyclic Shifted Identity) sub-matrices," filed Wednesday, Oct. 19, 2005.

Incorporation by Reference

The following U.S. Utility Patent Applications are hereby incorporated herein by reference in their entirety and made part of the present U.S. Utility Patent Application for all purposes:

1. U.S. Utility patent application Ser. No. 11/190,333, entitled "Construction of LDPC (Low Density Parity Check) codes using GRS (Generalized Reed-Solomon) code," filed Wednesday, Jul. 27, 2005, pending.

2. U.S. Utility patent application Ser. No. 11/264,997, entitled "Construction of Irregular LDPC (Low Density Parity Check) codes using R-S (Reed-Solomon) codes or GRS (Generalized Reed-Solomon) code," filed Wednesday, Nov. 2, 2005, pending.

3. U.S. Utility patent application Ser. No. 11/292,135, entitled "Algebraic construction of LDPC (Low Density Parity Check) codes with corresponding parity check matrix having CSI (Cyclic Shifted Identity) sub-matrices," filed Thursday, Dec. 1, 2005, pending.

4. U.S. Utility patent application Ser. No. 11/472,226, entitled "Efficient construction of LDPC (Low Density Parity Check) codes with corresponding parity check matrix having CSI (Cyclic Shifted Identity) sub-matrices," filed concurrently on Wednesday, Jun. 21, 2006, pending.

BACKGROUND OF THE INVENTION

1. Technical Field of the Invention

The invention relates generally to communication systems; and, more particularly, it relates to encoding processing and/or decoding processing of information within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

There appears continually to be a need in the art for some alternative coding types and modulation implementations that can provide near-capacity achieving error correction. LDPC codes offer such performance and are such possible candidates for this ongoing development.

There is no generally agreed "best" method to follow for the construction of LDPC codes with good performance. In the following reference [a], a regular LDPC code is constructed based on two codewords of an R-S (Reed-Solomon) code.

[a] I. Djurdjevic, J. Xu, K. Abdel-Ghaffar and S. Lin, "A Class of Low-Density Parity-Check Codes Constructed Based on Reed-Solomon Codes With Two Information Symbols," *IEEE Communications Letters*, vol. 7, no. 7, July 2003, pp. 317-319.

However, this LDPC codes presented using the approach of this prior art reference are of a very narrow type and there is very little, if any, flexibility presented by this approach by which other types of LDPC codes may be designed. This lack of flexibility presents a significant challenge for any designed of such LDPC codes and/or communication devices to be implemented using such LDPC codes. Clearly, there seems to be a continual need for additional and better types of codes for use in various communication systems to provide for better means of error correction and better BER while operating at various amounts of SNR.

There are a wide variety of types of communication systems. Communication systems are known to support wireless and wire lined communications between wireless and/or wire lined communication devices. Such communication systems range from national and/or international cellular telephone systems to the Internet to point-to-point in-home wireless networks, and to other types of communication systems. Each type of communication system is constructed, and hence operates, in accordance with one or more communication standards. For instance, wireless communication systems may operate in accordance with one or more standards including, but not limited to, IEEE (Institute of Electrical & Electronics Engineers) 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc. communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In many systems, the transmitter will include one antenna for transmitting the RF signals, which are received by a single antenna, or multiple antennas, of a receiver. When the receiver includes two or more antennas, the receiver will select one of them to receive the incoming RF signals. In this instance, the wireless communication between the transmitter and receiver is a single-output-single-input (SISO) communication, even if the receiver includes multiple antennas that are used as diversity antennas (i.e., selecting one of them to receive the incoming RF signals). For SISO wireless communications, a transceiver includes one transmitter and one receiver. Currently, most wireless local area networks (WLAN) that are IEEE 802.11, 802.11a, 802,11b, or 802.11g employ SISO wireless communications.

Other types of wireless communications include single-input-multiple-output (SIMO), multiple-input-single-output (MISO), and multiple-input-multiple-output (MIMO). In a SIMO wireless communication, a single transmitter processes data into radio frequency signals that are transmitted to a receiver. The receiver includes two or more antennas and two or more receiver paths. Each of the antennas receives the RF signals and provides them to a corresponding receiver path (e.g., LNA, down conversion module, filters, and ADCs). Each of the receiver paths processes the received RF signals to produce digital signals, which are combined and then processed to recapture the transmitted data.

For a multiple-input-single-output (MISO) wireless communication, the transmitter includes two or more transmission paths (e.g., digital to analog converter, filters, up-conversion module, and a power amplifier) that each converts a corresponding portion of baseband signals into RF signals, which are transmitted via corresponding antennas to a receiver. The receiver includes a single receiver path that receives the multiple RF signals from the transmitter.

For a multiple-input-multiple-output (MIMO) wireless communication, the transmitter and receiver each include multiple paths. In such a communication, the transmitter parallel processes data using a spatial and time encoding function to produce two or more streams of data. The transmitter includes multiple transmission paths to convert each stream of data into multiple RF signals. The receiver receives the multiple RF signals via multiple receiver paths that recapture the streams of data utilizing a spatial and time decoding function. The recaptured streams of data are combined and subsequently processed to recover the original data.

In such SISO, MISO, and MIMO communication systems, as within other types of communication systems, there is a continual need for additional and better types of codes for use in various communication systems to provide for better means of error correction and better BER while operating at various amounts of SNR.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL
VIEWS OF THE DRAWINGS

DETAILED DESCRIPTION OF THE INVENTION

Figure 1:
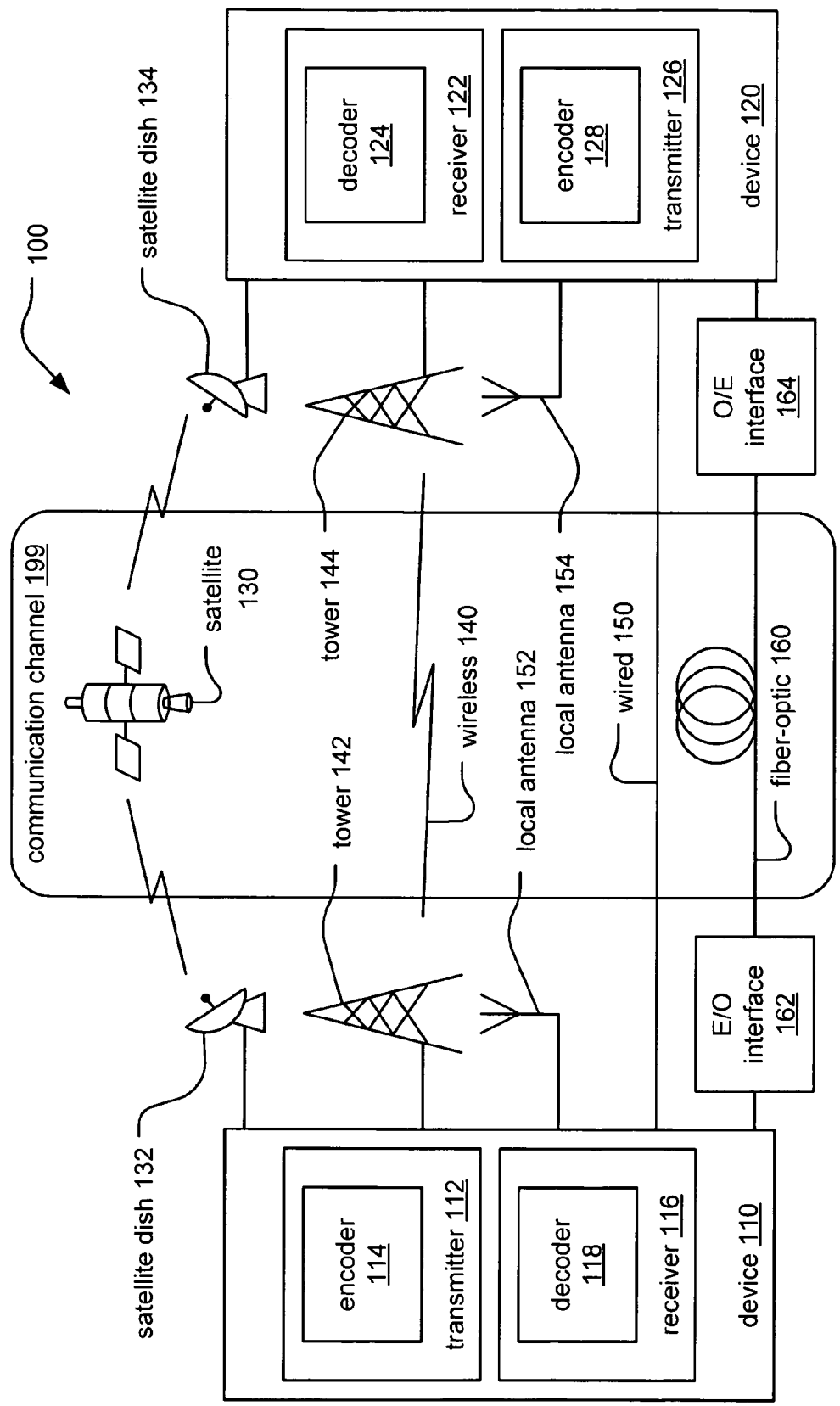
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
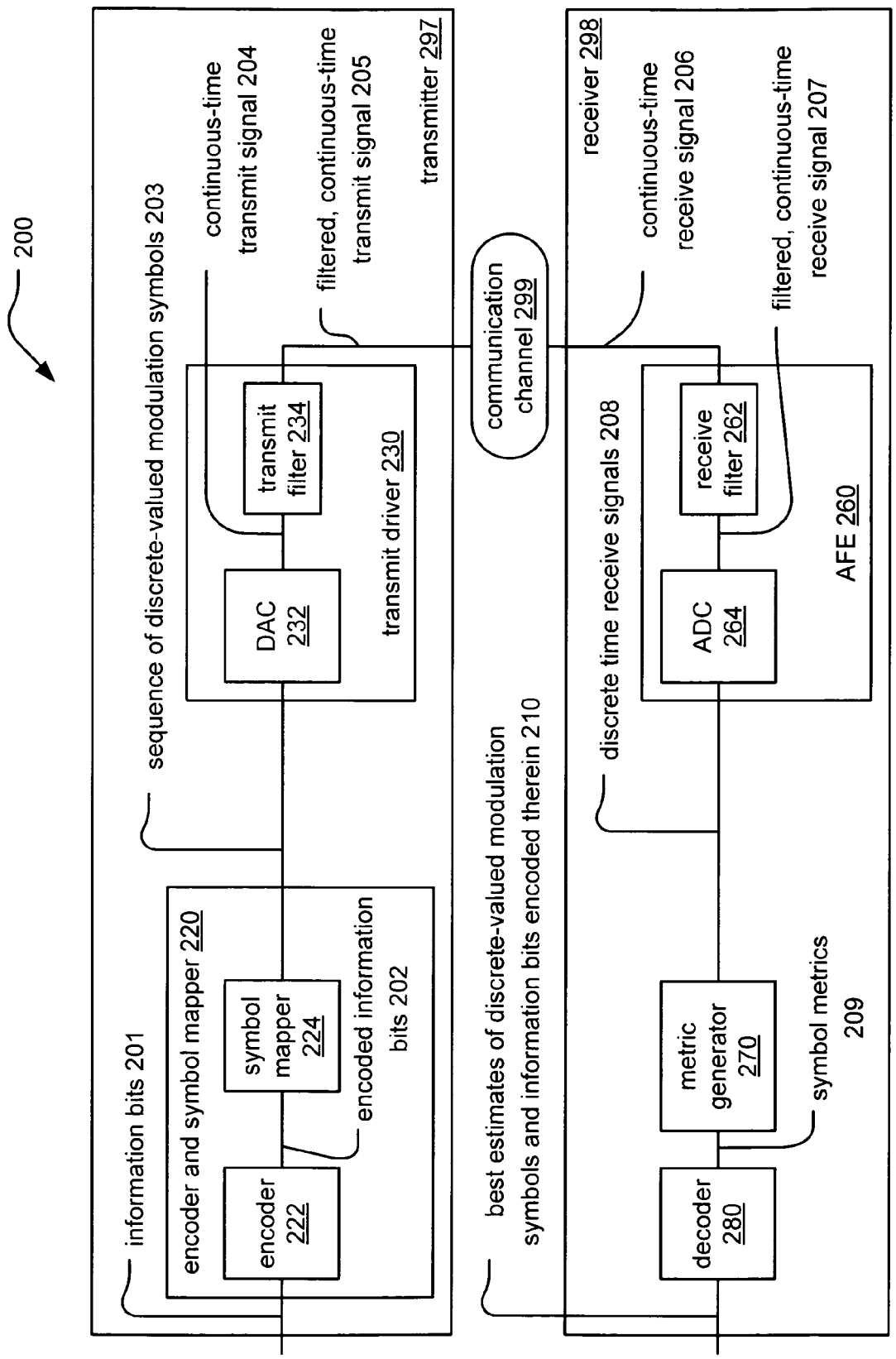

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
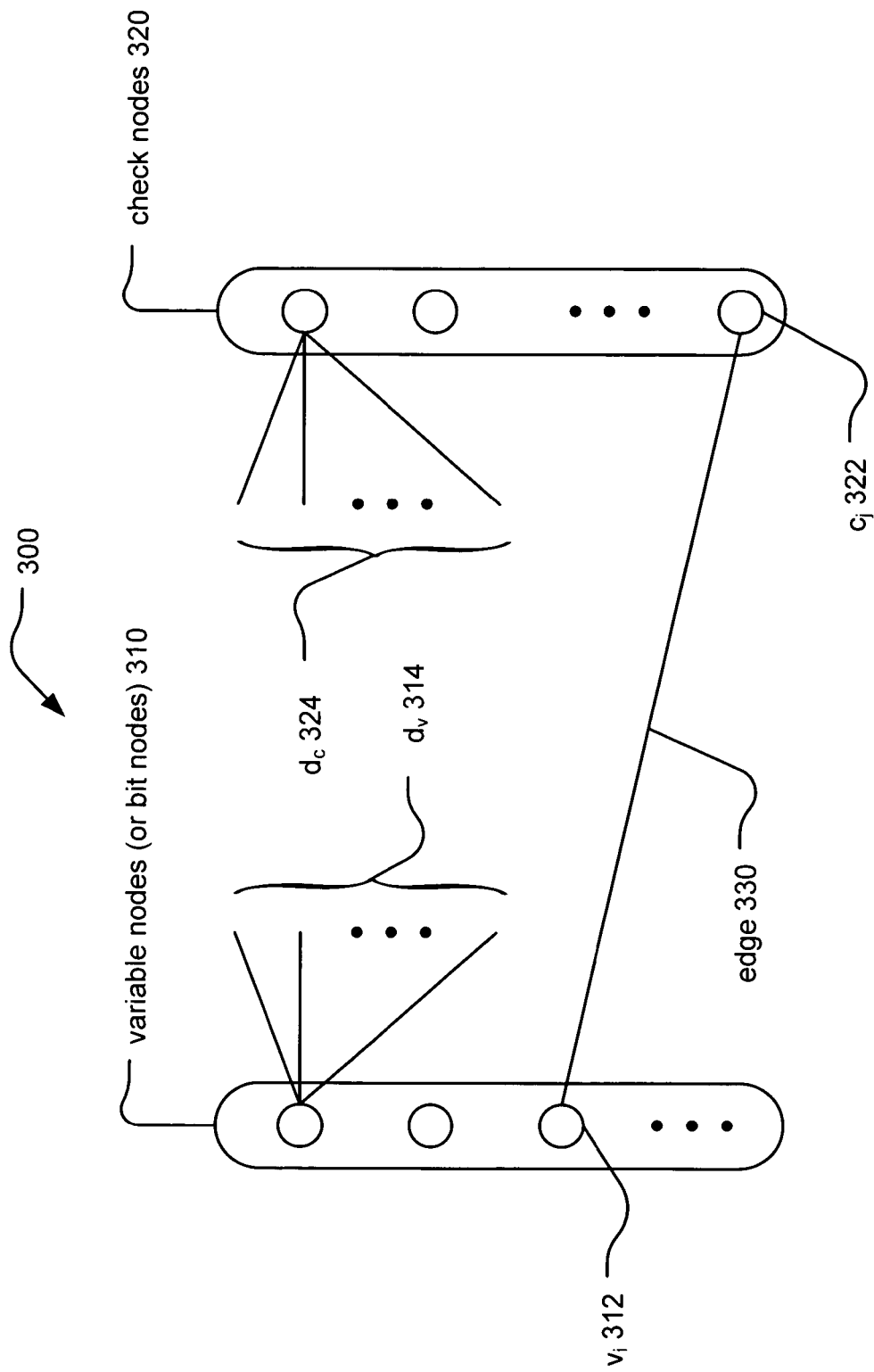
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass. *MIT Press*, 1963.

[2] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e), c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1}$$

-continued and $$\rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

Two methods are presented below that may operate using at least one LDPC code that has been constructed in accordance with certain aspects and/or embodiments of the invention.

Figure 4:
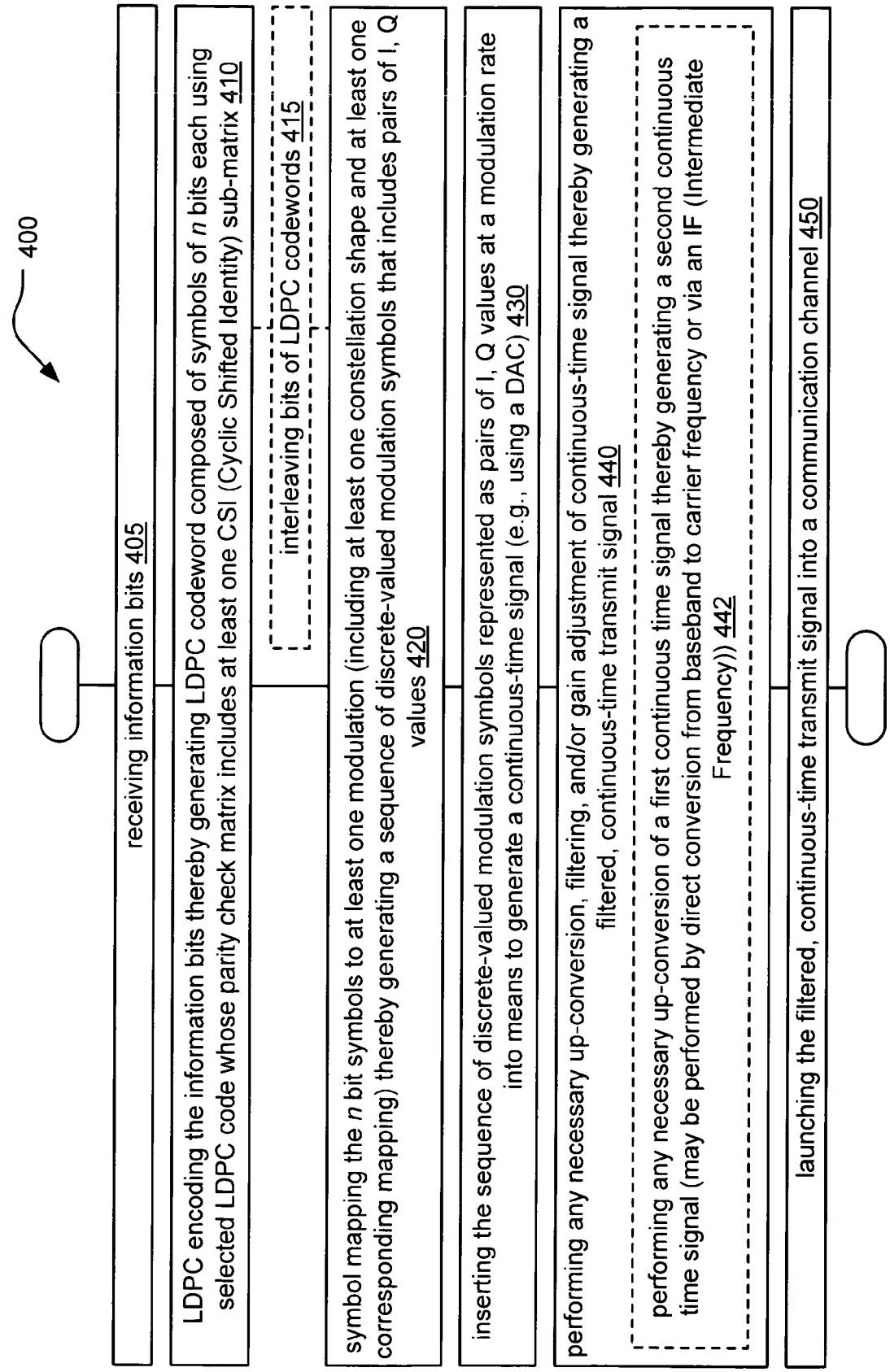
FIG. 4 illustrates an embodiment of a method for transmit processing of an LDPC coded signal generated using a selected LDPC code whose parity check matrix includes at least one CSI sub-matrix.

FIG. 4 illustrates an embodiment of a method for transmit processing 400 of an LDPC coded signal generated using a selected LDPC code whose parity check matrix includes at least one CSI sub-matrix. This diagram shows a method that may be viewed as being performed at a transmitter end of a communication channel.

This method also may be viewed as involving the generation of an LDPC coded signal as well as any operations to that are required to comport the LDPC coded signal to a communication channel into which a corresponding continuous-time transmit signal is to be launched.

Initially, this method involves receiving information bits, as shown in a block 405. These information bits correspond to the actual information that is desired to be transmitted from one end of a communication channel to the other. At the other end, an effort to making best estimates of these original information bits is made. Continuing on, this method involves LDPC encoding the information bits thereby generating an LDPC codeword (or LDPC code block) composed of symbols of n bits each, as shown in a block 410. This encoding may be performed using a selected LDPC code whose parity check matrix includes at least one CSI (Cyclic Shifted Identity) sub-matrix. In some instances, the method may also involve interleaving the bits of a LDPC codeword (or LDPC code block) after encoding them using an LDPC code, as shown in a block 415.

Then, as shown in a block 420, the method then continues on by symbol mapping the n bit symbols to at least one modulation (that includes at least one constellation shape and at least one corresponding mapping). In some embodiments, these n bit symbols are mapped to a number of different modulation types thereby generating a variable modulation and/or code rate signal whose modulation and/or code rate may vary as frequently as on a frame by frame basis or even as frequently as on a symbol by symbol basis. This symbol mapping of the n bit symbols to at least one modulation thereby generates a sequence of discrete-valued modulation symbols that includes pairs of I, Q values (or higher dimensional constellation). It is also noted that n is an integer. At this point, the sequence of discrete-valued modulation symbols may be viewed as being an LDPC coded modulation signal (being in completely digital form at this point).

The method then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method may involve performing any necessary up-conversion, filtering, and/or gain adjustment of the continuous-time signal (e.g., the continuous-time baseband signal) thereby generating a filtered, continuous-time transmit signal, as shown in a block 440. This processing to generate the continuous-time signal may also involve performing any necessary up-conversion of a first continuous-time signal thereby generating a second continuous-time signal, or may involve direct conversion from baseband to carrier frequency or via an IF (Intermediate Frequency), as shown in a block 442.

There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). Each of these 2 diagram illustrated and described below show some possible method alternatives by which the receive processing of such a received continuous-time signal (e.g., at a receiver end of a communication channel) may be performed in an effort ultimately to make best estimates of the information bits that had been encoded therein.

Figure 5:
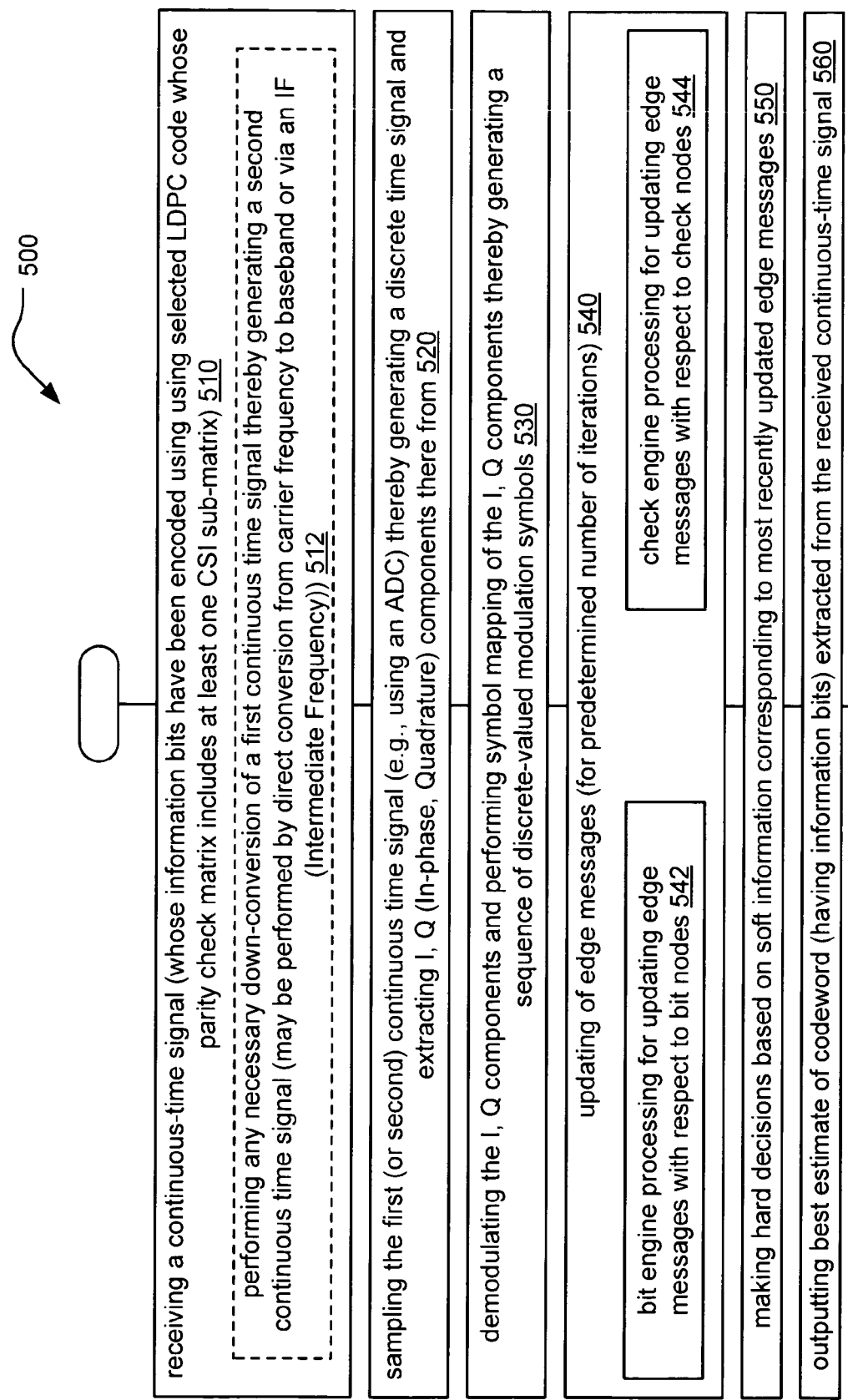
FIG. 5 illustrates an embodiment of a method for receive processing of an LDPC coded signal that has been generated using a selected LDPC code whose parity check matrix includes at least one CSI sub-matrix.

FIG. 5 illustrates an embodiment of a method for receive processing 500 of an LDPC coded signal that has been generated using a selected LDPC code whose parity check matrix includes at least one CSI sub-matrix. The method initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method.

The method also involves sampling the first (or second) continuous-time signal thereby generating a discrete time signal and extracting I, Q (In-phase, Quadrature) components there from, as shown in a block 520. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method then involves demodulating the I, Q components and performing symbol mapping of the I, Q components thereby generating a sequence of discrete-valued modulation symbols, as shown in a block 530.

The next step of the method of this embodiment involves performing updating of edge messages for a predetermined number of iterations, as shown in a block 540. This step may be viewed as performing the LDPC decoding in accordance with any of the various embodiments described above. This LDPC decoding generally involves bit engine processing for updating edge messages with respect to bit nodes (as shown in a block 542) as well as check engine processing for updating edge messages with respect to check nodes (as shown in a block 544).

After the final decoding iteration of the predetermined number of decoding iterations (or until all syndromes of the LDPC code are equal to zero in an alternative embodiment), the method involves making hard decisions based on soft information corresponding to most recently updated edge messages with respect to the bit nodes, as shown in a block 550. The method ultimately involves outputting a best estimate of the LDPC codeword (or LDPC code block) (that includes the information bits) that has been extracted from the received continuous-time signal, as shown in a block 560.

In this disclosure, it is noted that once the low density parity check matrix, H, is available for use in decoding processing at a receiving end of a communication channel, the corresponding generator matrix, G, of the LDPC code may be generated straightforwardly from the low density parity check matrix, H. Having this information allows a designer to implement the encoding processing (using the generator matrix, G, of the LDPC code) at the transmitter end of the communication channel and also to decoding processing (using the low density parity check matrix, H, of the LDPC code) at the receiver end of the communication channel. In fact, it is common in the art that an LDPC code is defined directly from the low density parity check matrix, H. Stated another way, the low density parity check matrix, H, includes all of the necessary information to define the LDPC code.

Figure 6:
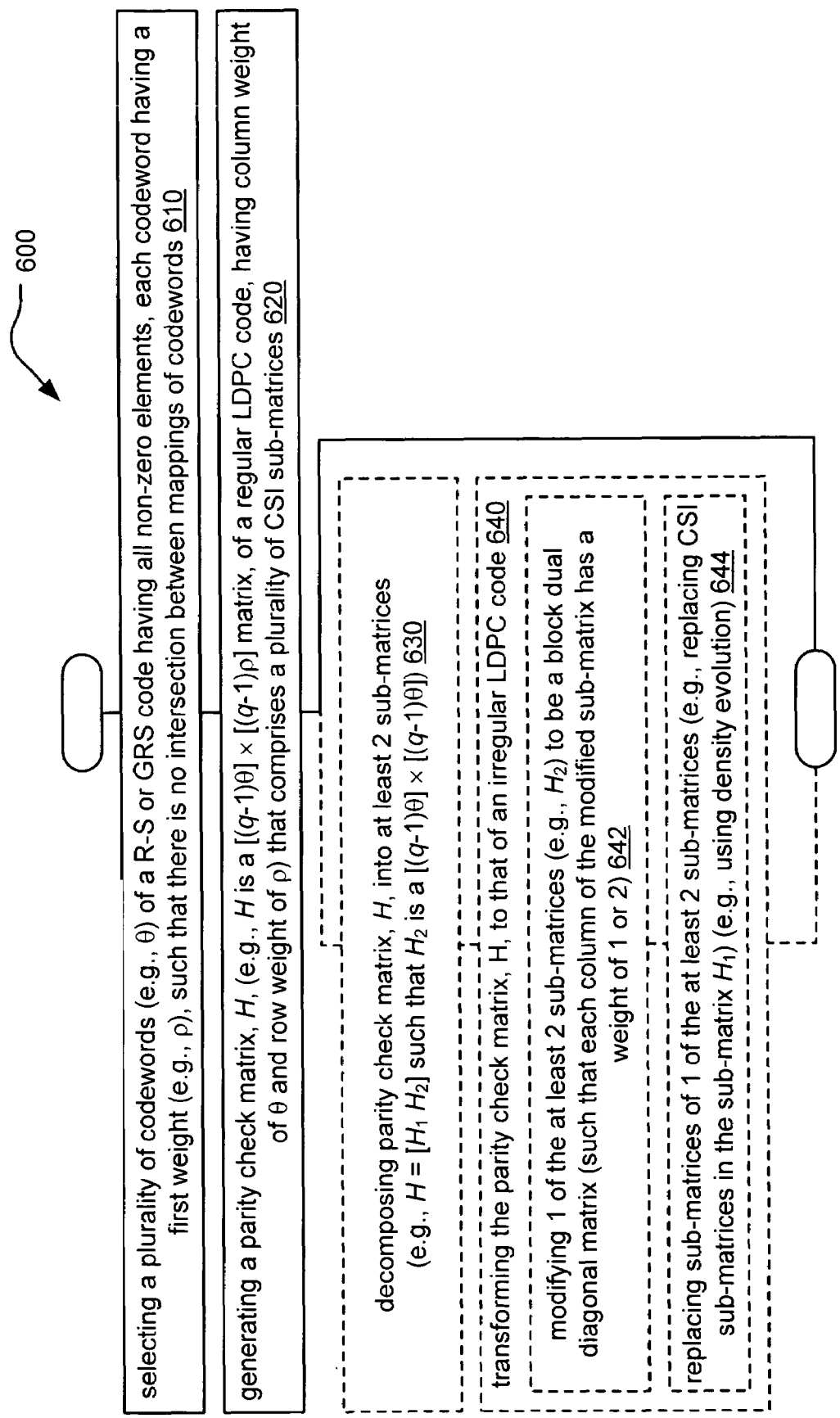
FIG. 6 illustrates an embodiment of a method for constructing a parity check matrix corresponding to a regular or an irregular LDPC code.

FIG. 6 illustrates an embodiment of a method 600 for constructing a parity check matrix corresponding to a regular or an irregular LDPC code.

As shown in a block 610, the method 600 begins by selecting a plurality of codewords (e.g., $\theta$) of a R-S (Reed-Solomon) or GRS (Generalized Reed-Solomon) code having all non-zero elements. Also, each codeword of the selected plurality of codewords has a first weight (e.g., $\rho$). Moreover, the conditions as prescribed above by (EQ 14) must also be satisfied, in that, there should be no intersection between the mappings of the selected codewords.

Then, as shown in a block 620, the method 600 continues by generating a parity check matrix, H, (e.g., H is a $[[(q-1)\theta \times (q-1)\rho]$ matrix, of a regular LDPC code, having column weight of $\theta$ and row weight of $\rho$). This parity check matrix, H, is composed of a plurality of CSI sub-matrices. This parity check matrix, H, also corresponds to a regular LDPC code. Based on the exponent, $i_0$, of the primitive element, $\alpha$ (i.e., depicted as $\alpha^{i_0}$), of the individual elements of the selected R-S or GRS codewords, that particular row, $i_0$, of the identity sub-matrix is cyclic shifted thereby generating a CSI (Cyclic Shifted Identity) sub-matrix. As an example, if the CSI sub-matrix is depicted as being, $I_s(\alpha^3)$, then that particular identity sub-matrix corresponding to that element of the R-S or GRS codeword undergoes cyclic shifting of the $3^{rd}$ row (i.e., where $i_0=3$, from $\alpha^{i_0}=\alpha^3$).

As shown in a block 630, the parity check matrix, H, that corresponds to a regular LDPC code may be decomposed into at least 2 separate sub-matrices (e.g., $H=[H_1 \ H_2]$). Thereafter, as shown in a block 640, this decomposed parity check matrix, H, may be transformed to correspond to an irregular LDPC code. As shown in a block 642, the method 600 involves modifying 1 of the at least 2 sub-matrices (e.g., $H_2$) to be a block dual diagonal matrix (such that each column of the modified sub-matrix has a weight of 1 or 2). Also, as shown in a block 644, the method 600 involves replacing sub-matrices of 1 of the at least 2 sub-matrices (e.g., CSI sub-matrices in the sub-matrix $H_1$). For example, this may be performed using the density evolution approach as is known in the art.

Figure 7:
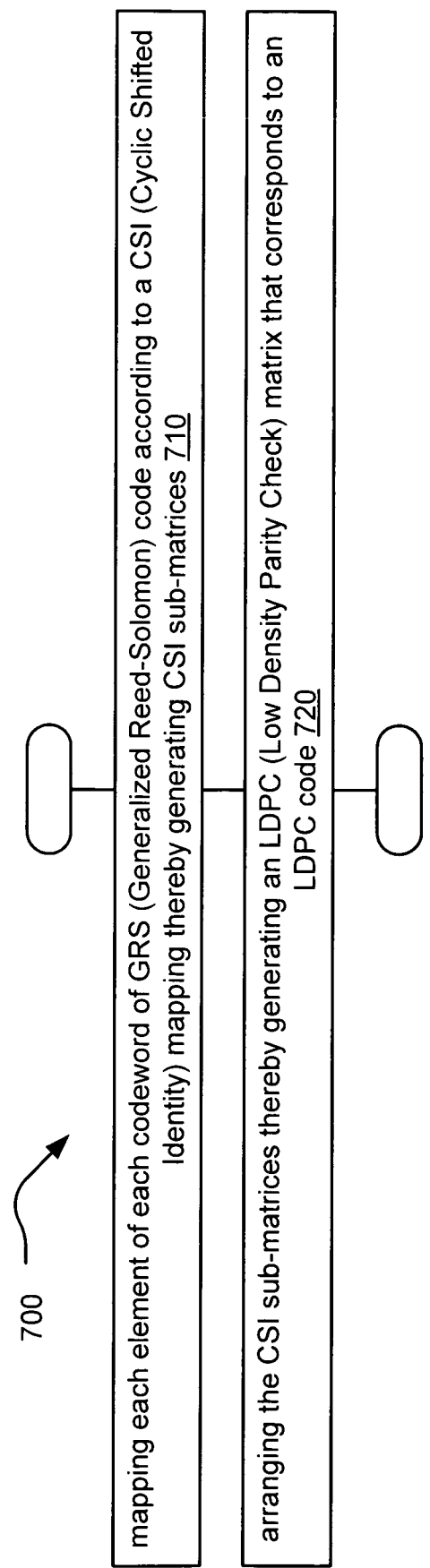
FIG. 7 and FIG. 8 illustrate alternative embodiments of methods for constructing a parity check matrix corresponding to a regular or an irregular LDPC code.
Figure 8:
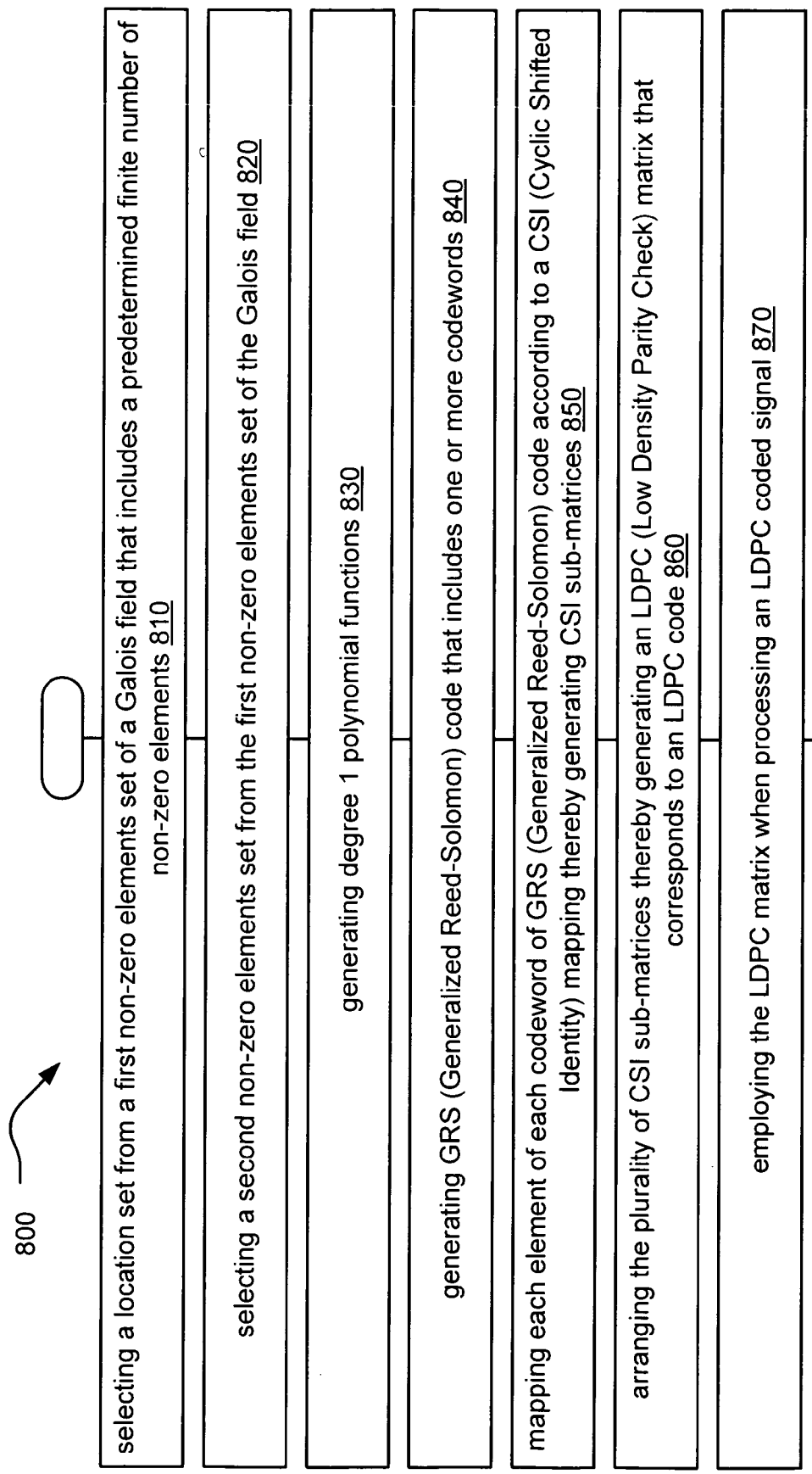

FIG. 7 and FIG. 8 illustrate alternative embodiments of methods for constructing a parity check matrix corresponding to a regular or an irregular LDPC code.

Referring to method 700 of the FIG. 7, the method 700 involves mapping each element of each codeword of GRS (Generalized Reed-Solomon) code according to a CSI (Cyclic Shifted Identity) mapping thereby generating CSI sub-matrices, as shown in a block 710. Then, the method involves arranging the CSI sub-matrices thereby generating an LDPC matrix that corresponds to an LDPC (Low Density Parity Check) code, as shown in a block 720. Great latitude is provided to the manner in which the plurality of CSI sub-matrices is arranged, and several possible embodiments are provided above.

Referring to method 800 of the FIG. 8, the method 800 involves selecting a location set from a first non-zero elements set of a Galois field that includes a predetermined finite number of non-zero elements, as shown in a block 810. This first non-zero elements set of the Galois field can be viewed as being a modified Galois field includes one less element (i.e., no all 0 valued element) than an original Galois field. The method 800 then continues by selecting a second non-zero elements set from the first non-zero elements set of the Galois field, as shown in a block 820.

Thereafter, the method 800 involves generating a number of degree 1 polynomial functions, as shown in a block 830. Each of these degree 1 polynomial function is a function of one corresponding coefficient of a number of coefficients and one constant of a number of constants. The number of coefficients and the number of constants are determined by the location set and the second non-zero elements set. Several embodiments above describe and show possible means by which these values may be determined based on some constraints set forth by a designer. For example, the constraints set forth in the design of the LDPC code determine the structure of the LDPC code. Moreover, each degree 1 polynomial function of the number of degree 1 polynomial functions is a non-scalar multiple of every other 1 polynomial function of the number of degree 1 polynomial functions.

The method 800 then involves generating GRS (Generalized Reed-Solomon) code that includes one or more codewords, as shown in a block 840. Each codeword of the GRS code includes a number of codeword elements. The multiple codeword elements corresponding to all codewords of the GRS code form a subset of the first non-zero elements set of the Galois field. Also, each codeword element of each codeword is a product of one element of the non-zero elements set and a resultant generated from one degree 1 polynomial function of the number of degree 1 polynomial functions evaluated at one element of the location set.

As shown in a block 850, the method 800 then involves mapping each element of each codeword of the GRS code according to a CSI (Cyclic Shifted Identity) mapping thereby generating CSI sub-matrices. The method 800 then involves arranging the CSI sub-matrices thereby generating an LDPC matrix that corresponds to an LDPC code, as shown in a block 860. The method 800 then involves employing the LDPC matrix when processing an LDPC coded signal, as shown in a block 870. This processing of an LDPC coded signal can involve encoding of information bits to generate an LDPC coded signal and/or decoding of an LDPC coded signal to make best estimates of the information bits encoded therein.

In the U.S. Utility patent application Ser. No. 11/292,135, entitled "Algebraic construction of LDPC (Low Density Parity Check) codes with corresponding parity check matrix having CSI (Cyclic Shifted Identity) sub-matrices," which has been incorporated herein by reference above for all purposes, an approach is made to construct regular and irregular LDPC codes with a corresponding parity check matrix having CSI sub-matrices. The parity check matrix, H, of such LDPC codes has the following form:

$$H = \begin{bmatrix} S_{0,0} & S_{0,1} & \cdots & S_{0,k} \\ \vdots & & \ddots & \vdots \\ S_{l,0} & S_{l,1} & \cdots & S_{l,k} \end{bmatrix} \quad (EQ\ 1)$$

where $S_{i,j}$ is an s×s sub-matrix. Each $S_{i,j}$ is either an all zero valued matrix (i.e., all elements are 0) or a CSI matrix (i.e., cyclic shifted identity matrix).

If the number of non-zero sub-matrices in all of the rows of the parity check matrix, H, is the same number of non-zero sub-matrices in all of the columns of the parity check matrix, H, then the LDPC code is regular; otherwise, the LDPC code is irregular.

Some special classes of irregular (n,k) LDPC codes have their parity check matrix, H, defined as follows:

H=[$H_1$ $H_2$] such that $H_1$ is an (N−K)×K matrix and $H_2$ is an (N−K)×(N−K) matrix, where N is the "block size" of the LDPC code and K is the "number of information bits" of the LDPC code. According to this representation, there are at least 4 classes of such LDPC codes as depicted below, where N=n·s and K=k·s.

$$H_2 = \begin{bmatrix} I & 0 & \cdots & 0 & 0 \\ I & I & & 0 & 0 \\ \vdots & \vdots & \ddots & \vdots & \vdots \\ 0 & 0 & & I & 0 \\ 0 & 0 & \cdots & I & I \end{bmatrix} \quad \text{Class 1}$$

where I is an s×s identify matrix, and 0 is an s×s all zero valued matrix (i.e., all elements are 0).

$$H_2 = \begin{bmatrix} I & 0 & \cdots & 0 & I(-1) \\ I & I & & 0 & 0 \\ \vdots & \vdots & \ddots & \vdots & \vdots \\ 0 & 0 & & I & 0 \\ 0 & 0 & \cdots & I & I \end{bmatrix} \quad \text{Class 2}$$

where I(−1) is an s×s identify matrix obtained by left cyclic shifting one position of the identity matrix, and 0 is an s×s all zero valued matrix (i.e., all elements are 0). The I(−1) matrix is shown below.

$$I(-1) = \begin{bmatrix} 0 & 0 & \cdots & 0 & 1 \\ 1 & 0 & \cdots & 0 & 0 \\ \vdots & 1 & \ddots & \vdots & \vdots \\ 0 & 0 & \ddots & 0 & 0 \\ 0 & 0 & \cdots & 1 & 0 \end{bmatrix} \quad \text{Class 3}$$

$$H_2 = \begin{bmatrix} I & 0 & \cdots & 0 & D \\ I & I & & 0 & 0 \\ \vdots & \vdots & \ddots & \vdots & \vdots \\ 0 & 0 & & I & 0 \\ 0 & 0 & \cdots & I & I \end{bmatrix}$$

where D is obtained by replacing the first row of the I(−1) matrix by an all zero vector, and 0 is an s×s all zero valued matrix (i.e., all elements are 0). The D matrix is represented below.

$$D = \begin{bmatrix} 0 & 0 & \cdots & 0 & 0 \\ 1 & 0 & \cdots & 0 & 0 \\ \vdots & 1 & \ddots & \vdots & \vdots \\ 0 & 0 & \ddots & 0 & 0 \\ 0 & 0 & \cdots & 1 & 0 \end{bmatrix}$$

Class 4: $H_2 = [H_{2,0} H_{2,1}]$, where $H_{2,0}$ is an $[(n-k)\cdot s] \times [(n-k-1)\cdot s]$ matrix and $H_{2,1}$ is an $[(n-k)\cdot s] \times s$ matrix.

$H_{2,0} = [I(m) 0 \ldots 0 I 0 \ldots 0 I(m)]^T$, and $$H_{2,1} = \begin{bmatrix} I & 0 & \cdots & 0 & 0 \\ I & I & \cdots & 0 & 0 \\ \vdots & \vdots & \ddots & \vdots & \vdots \\ 0 & 0 & \cdots & I & I \\ 0 & 0 & \cdots & 0 & I \end{bmatrix},$$

where:

(1) T indicates transpose (i.e., $H_{2,1}$ is a vertical vector or a matrix having only one column); and (2) I(m) is an s×s matrix obtained by right cyclic shifting the identity matrix, I, by m positions.

Also, in the U.S. Utility patent application Ser. No. 11/292,135, entitled "Algebraic construction of LDPC (Low Density Parity Check) codes with corresponding parity check matrix having CSI (Cyclic Shifted Identity) sub-matrices," an GRS-based LDPC code construction approach is presented that also employs CSI sub-matrices. The size of the sub-matrix is $(p^m-1) \times (p^m-1)$, where p is a prime number.

Below, two alternative LDPC code construction approaches are presented that are operable to generate LDPC codes with a corresponding parity check matrix having CSI (Cyclic Shifted Identity) sub-matrices of any size.

This provides a great deal of flexibility in the design of various LDPC codes, in that, the size of the sub-matrices is not limited to be $(p^m-1) \times (p^m-1)$, where p is a prime number. A much broader range of LDPC codes can then be designed according to the principles presented herein for a very broad range of communication system and communication device applications.

Approach 1:

LDPC Code Generation Using Shift-Values of Sub-Matrices

An (n,k) LDPC code can be characterized by an m×n low density parity check matrix, H, with rank (n−k) as follows:

$$H = \begin{bmatrix} h_{0,0} & h_{0,1} & \cdots & h_{0,n-1} \\ h_{1,0} & h_{1,1} & \cdots & h_{1,n-1} \\ \vdots & \vdots & \ddots & \vdots \\ h_{m-1,0} & h_{m-1,1} & \cdots & h_{m-1,n-1} \end{bmatrix}$$

A special type of low density parity check matrix, H, that includes a plurality of CSI (Cyclic Shifted Identity) sub-matrices can be characterized as follows:

$$H = \begin{bmatrix} S_{0,0} & S_{0,1} & \cdots & S_{0,N-1} \\ S_{1,0} & S_{1,1} & \cdots & S_{1,N-1} \\ \vdots & \vdots & \ddots & \vdots \\ S_{M-1,0} & S_{M-1,1} & \cdots & S_{M-1,N-1} \end{bmatrix},$$

where m=M·q, n=N·q, and each $S_{I,j}$ is an q×q sub-matrix. Each sub-matrix, $S_{I,j}$, is either an all zero valued matrix (i.e., all elements are 0) or a CSI matrix (i.e., cyclic shifted identity matrix).

Each CSI sub-matrix, $S_{I,j}$, is characterized by a shift-value, $\lambda(S)$, such that the components of S are defined as follows:

$$s_{i,j} = \begin{cases} 1, & i + \lambda(S) = j \pmod{q} \\ 0, & \text{otherwise} \end{cases}$$

For each element $h_{i,j}$ of the low density parity check matrix, H, let $\Omega(h_{i,j})$ denote $S_{I,J}$, which is the sub-matrix to which $h_{i,j}$ belongs (i.e., I=floor(i/q) and J=floor(j/q)).

For an even positive integer, w, a "w-cycle" (i.e., a size "w" loop in the corresponding LDPC bipartite graph) in an LDPC code with low density parity check matrix, H, is an ordered list of w distinct non-zero elements $(h_{i_0,j_0}, h_{i_1,j_1}, \ldots, h_{i_{w-1},j_{w-1}})$ such that $i_0=i_1$, $j_0=j_{w-1}$, and for any l, 0<l<w/2, $i_{2l}=i_{2l+1}$, and $j_{2l-1}=j_{2l}$.

Theorem 1:

Let H be a parity matrix consisting of cyclic shifted identity sub-matrices. Let $\Gamma=(h_{i_0,j_0}, h_{i_1,j_1}, \ldots, h_{i_{w-1},j_{w-1}})$ be an ordered list of w distinct non-zero elements in H, with w an even integer. Let $S_{l_l,j_l}=\Omega(h_{i_l,j_l})$ for $0 \leq l < w$. For notational simplicity, let $\lambda_l$ denote $\lambda(S_{I_l,J_l})$, the shift-value of $S_{I_l,J_l}$. If $\Gamma$ is a w-cycle, then (1) $I_0=I_1$, $J_0=J_{w-1}$, and, for any l, 0<l<w/2, $I_{2l}=I_{2l+1}$ and $J_{2l-1}=J_{2l}$; and $$\sum_{l=0}^{w-1} (-1)^l \lambda_l \equiv 0 \pmod{q}. \quad (2)$$

Proof of Theorem 1:
By the definition of a w-cycle, (1) holds. Also, by the definition of a cyclic shifted identity submatrix, $h_{i_l,j_l}$ is a non-zero element implies $$i_l + \lambda_l \equiv j_l \pmod{q}, 0 \leq l < w$$

So, partition the set of equations above into two parts and sum them:

$$\sum_{l=0}^{\frac{w}{2}-1} \lambda_{2l} \equiv \sum_{l=0}^{\frac{w}{2}-1} (j_{2l}) - \sum_{l=0}^{\frac{w}{2}-1} (i_{2l}) \pmod{q}$$

$$-\sum_{l=0}^{\frac{w}{2}-1} \lambda_{2l+1} \equiv -\sum_{l=0}^{\frac{w}{2}-1} (j_{2l+1}) + \sum_{l=0}^{\frac{w}{2}-1} (i_{2l+1}) \pmod{q}$$

By the premise that $\Gamma$ is a cycle, adding both of the equations above yields (2) and proves the theorem.

Theorem 2:
Let $S_{i_0,J_0}, S_{i_1,J_1}, \ldots, S_{i_{w-1},J_{w-1}}$ be a list of cyclic shifted identity sub-matrices in H, with w an even integer. Again, let $\lambda_l$ denote $\lambda(S_{i_l,J_l})$, the shift-value of $S_{i_l,J_l}$. If conditions (1) and (2) in Theorem 1 hold, then H contains q distinct w-cycles, $(h_{i_0,j_0}, h_{i_1,j_1}, \ldots, h_{i_{w-1},j_{w-1}})$, such that $S_{I_l,J_l} = \Omega(h_{i_l,j_l})$ for $0 \leq l < w$.

Proof of Theorem 2:
Let r be an arbitrary number between 0 and q−1. Define $i_l$ and $j_l$ by the formulas below:

a. $i_0 = q*I_0 + ((r-\lambda_0) \bmod q)$ and $j_0 = q*J_0 + r$;

b. for l, 0<l<w, l an odd integer, $$i_l = i_{l-1} \text{ and } j_l = q*J_l + \left(\left(r - \sum_{k=0}^{l}(-1)^k \lambda_k\right) \bmod q\right);$$

c. for l, 0<l<w, l an even integer, $$i_l = q*I_l + \left(\left(r - \sum_{k=0}^{l}(-1)^k \lambda_k\right) \bmod q\right) \text{ and } j_l = j_{l-1}.$$

By condition (1) of Theorem 1, it's easy to verify that $S_{i_l,j_l} = \Omega(h_{i_l,j_l})$ for 0<l<w. Also, by condition (2), $j_{w-1} = q*J_{w-1} + r$, which equals $j_0$. Thus, $(h_{i_0,j_0},\ldots,h_{i_{w-1},j_{w-1}})$, as constructed, is a w-cycle. Since there are q distinct choices for r, the theorem is proven.

It is also noted with respect to each of the approaches described above that correspond to Theorem 1 and Theorem 2, relatively similar results can be found in the following prior art reference [4] that employs a different approach:

[4] Marc P. C. Fossorier, "Quasi-Cyclic Low-Density Parity-Check Codes From Circulant Permutation Matrices," *IEEE Trans. Inform. Theory*, Vol. 50. No. 8, August 2004, pp. 1788-1793.

Observation:
With this pair of Theorems presented above, it is sufficient to check the shift-values, $\lambda(S)$, of the sub-matrices of the low density parity check matrix, H. This can be performed instead of checking for the positions of the non-zero elements within the low density parity check matrix, H. This is a major savings in terms of the complexity of the design and construction of an LDPC code (i.e., construction of the low density parity check matrix, H, of an LDPC code).

Since the number of sub-matrices is then q times fewer than the number of non-zero elements in the low density parity check matrix, H, this observation provides a much more efficient means of finding and avoiding the cycles in the LDPC code.

In some previous approaches, to determine the number of cycles in the LDPC code, the entire low density parity check matrix, H, had to be constructed and the LDPC bipartite graph corresponding thereto had to be analyzed. From the analysis of the corresponding LDPC bipartite graph, then the number of cycles (e.g., 4-cycles) therein could be ascertained. Therefore, according to this approach, a designer would have to go through the entire process of generating the entire LDPC code and analyzing it before it could be determined whether or not that given LDPC is a good candidate. There is no way to eliminate those LDPC codes that are poor candidates early on in the LDPC design process. This prior approach is a very burdensome and intensive means by which to determine the number of cycles (or loops) within the LDPC code (i.e., within the corresponding LDPC bipartite graph).

In contradistinction and in accordance with certain aspects of the invention, a novel and much more efficient approach by which the finding and avoiding of the cycles in the LDPC code can be performed is presented below. This novel approach allows an LDPC code designer to eliminate those LDPC codes that do not meet with the design criteria very early on in the process. This provides for a much more efficient design process.

Figure 9:
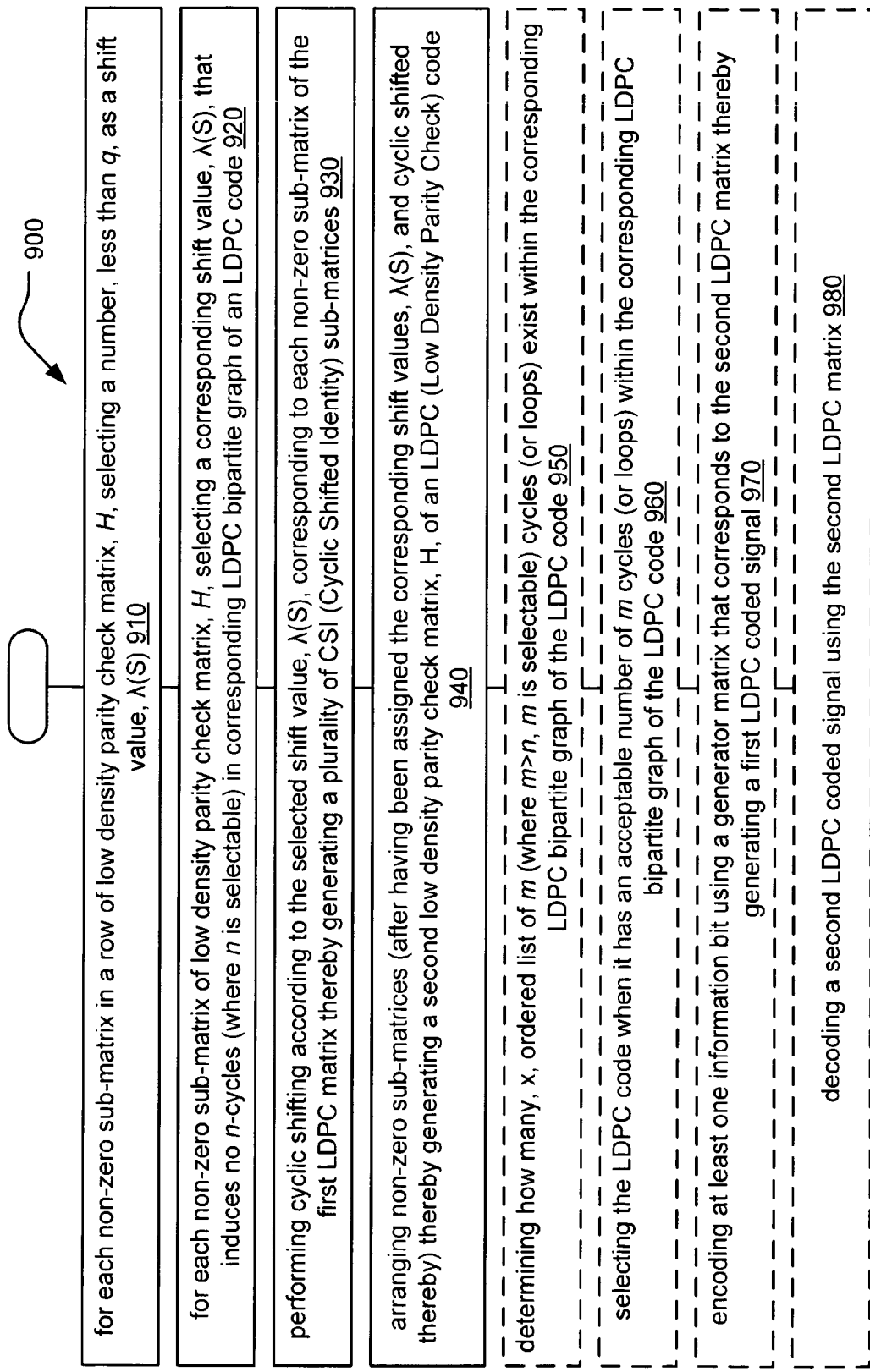
FIG. 9 illustrates an embodiment of a method for constructing 1 or more LDPC codes having an acceptable number of size n and/or size m loops.

Approach to Finding and Avoiding the Cycles:
FIG. 9 illustrates an embodiment of a method 900 for constructing 1 or more LDPC codes having an acceptable number of size n and/or size m loops. In some embodiments, no size n loops are acceptable, and only a predetermined sufficiently low number of size m loops are acceptable.

It is well known that the performance of an LDPC code suffers if its low density parity check matrix, H, contains 4-cycles (i.e., size 4 loops in the corresponding LDPC bipartite graph of this LDPC code). It is also generally believed by the LDPC community that includes those having skill in the art of LDPC coding that, in general, the fewer the number of 6-cycles in an LDPC code, then the better the performance will be in terms of providing a lower error floors (i.e., lower BER (Bit Error Rate) as a function of SNR (Signal to Noise Ratio) for a given communication channel).

Using the result provided form the Theorem, an approach is generated for generating LDPC codes that are free of 4-cycles and that have relatively good performance.

1. For each of the non-zero sub-matrices, $S_{0,j}$, within one of the rows of the low density parity check matrix, H, select a number less than q as its shift-value, $\lambda(S)$. There are several means by which this can be performed. For example, this can involve the selection of a number less than q as the shift-value, $\lambda(S)$, for each of the non-zero sub-matrices, $S_{0,j}$, in the first row of the low density parity check matrix, H, according to some predetermined pattern. Alternatively, the this can involve the random selection of a number less than q as the shift-value, $\lambda(S)$, for each of the non-zero sub-matrices, $S_{0,j}$, in one of the rows of the low density parity check matrix, H, according to some predetermined pattern. Generally speaking, it is noted that this beginning row may be the first row in the low density parity check matrix, H, or it may be some other row therein as desired in a particular embodiment. Also, if it is desirable to employ some predetermined pattern for selecting the shift-values, $\lambda(s)$, (i.e., when not performing this selection randomly), certain design considerations may be made such as ensuring that each sub-matrix of this beginning row (which can be the first row) is an identity sub-matrix.

Whether beginning with the first row or some other row of the low density parity check matrix, H, and whether the shift values are randomly selected or found using some fixed pattern, this operation may be viewed as being performed in block 910, such that, for each non-zero sub-matrix in one of the rows of a first LDPC (Low Density Parity Check) matrix that includes a plurality of sub-matrices, the method 900 involves selecting a corresponding shift value that is less than at least one of a number of columns and a number of rows of each sub-matrix of the plurality of sub-matrices.

2. For each of the non-zero sub-matrix, $S_{I,J}$, use the result from the Theorem to determine which shift-value, $\lambda(S)$, would induce a 4-cycle in the LDPC code. If possible, randomly assign to a non-zero sub-matrix, $S_{I,J}$, a shift-value, $\lambda(S)$, that would NOT induce a 4-cycle in the LDPC code. If this cannot be performed, then the approach begins again in 1. (located just above). Clearly, this could be extended to apply to n-cycle (e.g., loops of size n, where n is selectable). Where n=4 is one possible case left to designer's choice. This operation may be viewed as being performed in block 920, such that, the method 900 involves, for every non-zero sub-matrix of the first LDPC matrix except those sub-matrices in the first row, selecting a corresponding shift value such that the corresponding shift values corresponding to all of the plurality of sub-matrices of the first LDPC matrix corporately either induce cycles of a first predetermined size in a first LDPC bipartite graph of a first LDPC code that corresponds to the first LDPC matrix, or induce no cycles smaller that a second predetermined size in the first LDPC bipartite graph of the first LDPC code that corresponds to the first LDPC matrix.

The method 900 then involves assigning each non-zero sub-matrix, $S_{I,J}$, a shift-value, $\lambda(S)$, that meets with these conditions (i.e., of not inducing a size n cycle), as shown in a block 930. This involves performing cyclic shifting according to the selected shift value, $\lambda(S)$, corresponding to each non-zero sub-matrix of the first LDPC matrix thereby generating a plurality of CSI sub-matrices 3. After every non-zero sub-matrix, $S_{I,J}$, has been assigned a shift-value, $\lambda(S)$, such that each of the non-zero sub-matrices, $S_{I,J}$, together generate a low density parity check matrix, H, that is free of 4-cycles, use the result of the Theorem to determine how many, x, ordered list of 6 distinct non-zero sub-matrices, $(S_{l_0,J_0}, S_{l_1,J_1}, \ldots, S_{l_5,J_5})$, satisfies the relationship of $$\sum_{i=0}^{5} (-1)^i \lambda(S_{l_i,J_i}) \equiv 0 (\mathrm{mod}(q)).$$

This number x is then multiplied by q to give the total number of 6-cycles in the LDPC code, $\mathrm{cycle}_6$.

$\mathrm{cycle}_6 = x \cdot q$

Clearly, this could also be extended to apply to m-cycle (e.g., loops of size m, where m is selectable and usually greater than n) as follows:

$$\sum_{i=0}^{m-1} (-1)^i \lambda(S_{l_i,J_i}) \equiv 0 (\mathrm{mod}(q)).$$

This number x is then multiplied by q to give the total number of m-cycles in the LDPC code, $\mathrm{cycle}_m$.

$\mathrm{cycle}_m = x \cdot q.$

Generally speaking, the method 900 continues by arranging non-zero sub-matrices (after having been assigned the corresponding shift values, $\lambda(S)$) thereby generating a second low density parity check matrix, H, of an LDPC (Low Density Parity Check) code, as shown in a block 940. The method 900 involves arranging the plurality of CSI sub-matrices and any all-zero-valued sub-matrix of the first LDPC matrix thereby generating a second LDPC matrix that corresponds to a second LDPC code.

Thereafter, the method 900 can involve employing the second LDPC matrix when processing an LDPC coded signal. This operation can be implemented using one or both of the operations as depicted within the blocks 970 and 980, which are described below.

4. A designer is then able to select and save those LDPC codes with an acceptable number of 6-cycles according to the design criteria being employed.

Generally speaking, the method 900 is then operable to perform determining of how many, x, ordered list of m (where m>n, m is selectable) cycles (or loops) exist within the corresponding LDPC bipartite graph of the LDPC code, as shown in a block 950. Where m=6 is one possible case left to designer's choice. Thereafter, the method 900 is operable to perform selecting the LDPC code when it has an acceptable number of m cycles (or loops) within the corresponding LDPC bipartite graph of the LDPC code, as shown in a block 960. Clearly, this processing can be performed to generate a plurality of LDPC codes.

It is noted that the operations of the blocks 950 and 960 are optional in some embodiments. That is to say, there may be instances where the construction of only 1 LDPC code meeting some of the conditions is desired (e.g. where the number of m cycles (or loops) within the corresponding LDPC bipartite graph of the LDPC code is not critical to the design process). In such instances, it may be sufficient only to have "an" LDPC code having no n cycles (or loops), and a broad range of numbers of m cycles (or loops) is tolerable. Clearly, based on the design criteria employed in a given embodiment, as well as the particular communication system and/or communication device into which the LDPC code is to be implemented, a wide variety of criteria may be employed without departing from the scope and spirit of the invention. That is to say, a plurality of LDPC codes meeting the design criteria can be generated, and only a subset of those may ultimately be selected as viable LDPC code options for the given application.

It is again noted here that this Approach 1 is operable to employ CSI sub-matrices of any size, and the size of the sub-matrices is not limited to be $(p^m-1) \times (p^m-1)$, where p is a prime number. Also, this Approach 1 is operable to look at the corresponding shift-value, $\lambda(S)$, of the various CSI sub-matrices during the design process to determine the number of cycles (or loops) that will occur in the corresponding LDPC bipartite graph of the LDPC code being constructed. This provides for very efficient design and selection of LDPC codes for a given application based on the design criteria being used.

Approach 2:

LDPC Code Generation Using GRS (Generalized Reed-Solomon) Code

Before presenting the details of the Approach 2, it is noted here that this Approach 2 (like the Approach 1 presented above) is also operable to employ CSI sub-matrices of any size, and the size of the sub-matrices is not limited to be $(p^m-1) \times (p^m-1)$, where p is a prime number.

Consider a finite field (Galois field) GF(q) of q elements, where $q = p^m$ and p is a prime number and integer m>0. Let α be a primitive element of this field.

A modified Galois field, or alternatively referred to as a non-zero elements set of a Galois field, can be defined as follows:

$$GF^*(q) = GF(q)/\{0\} = <\alpha> = \{\alpha, \ldots, \alpha^{q-1}\}. \quad \text{(EQ 2)}$$

This modified Galois field (again, which can be referred to as a non-zero elements set of the Galois field), GF*(q), indicates that there is no zero element (i.e., no element 0 or no all-zero vector in this finite field) therein (i.e., GF*(q) includes no all zero valued vector). Therefore, if the Galois field, GF(q), includes q elements, then the non-zero elements set of the Galois field, GF*(q), includes (q−1) elements. The terms modified Galois field, GF*(q), and non-zero elements set of the Galois field, GF*(q), can also used interchangeably.

Let λ be a positive integer such that λ|(q−1), meaning that λ is a factor of (q−1), such that λ=(q−1)×m, where m is an integer. Also, let μ=(q−1)/λ, such that μ denotes the size of the sub-matrix. Let $\beta = \alpha^\lambda$, and also denote a subset of the modified Galois field, GF*(q), as $GF_\lambda(q) = \{\beta, \ldots, \beta^\mu\}$. From some perspectives in some embodiments, the subset, $GF_\lambda(q) = \{\beta, \ldots, \beta^\mu\}$, of the non-zero elements set of the Galois field, GF*(q), is an ideal of the first non-zero elements set of the Galois field, GF*(q).

It is noted that an "ideal" is a known term in the art of modern algebra theory. Generally speaking, any 2 elements selected from an ideal of a set can be multiplied together and the resultant will also be in the same ideal. Therefore, any 2 elements in the ideal, $GF_\lambda(q)$, can be multiplied together and the resultant will also be in the same ideal, $GF_\lambda(q)$. It also follows that an "ideal" of a set is also generally a "subset" of that set as well.

An elementary vector $e_i(\lambda)$ can be defined in the binary space $\{0,1\}^\mu$ to be a vector of size μ such that its all components are 0 except the i-th component. Thus $$e_0(\lambda)=(1,0,\ldots,0), e_1(\lambda)=(0,1,\ldots,0),\ldots, e_\mu(\lambda)=(0,0,\ldots 1) \quad \text{(EQ 3)}$$

Define a location map $L: GF_\lambda(q) \to \{0,1\}^\mu$ such that $L(\beta^i) = e_i(\lambda)$.

A μ×μ identity matrix, $I_\mu$, is defined to be a matrix such that the entries (i.e., elements) in the diagonal are 1 and the rest of the entries are all 0. Therefore, $$I_\mu = \begin{bmatrix} e_0(\lambda) \\ e_1(\lambda) \\ \ldots \\ e_{\mu-1}(\lambda) \end{bmatrix} \quad \text{(EQ 4)}$$

A CSI (Cyclic Shifted Identity) matrix is obtained by cyclically shifting the every row in the same position.

Let $\gamma \in GF_\lambda(q)$ and $GF_\lambda(q) = \langle \beta \rangle$. Then it is obvious that $\beta^i \gamma \neq \beta^j \gamma$ if $0 \leq i, j \leq \mu-1$ and $i \neq j$. Define the following μ×μ binary matrix according to the CSI mapping:

$$I_\lambda(\gamma) = \begin{bmatrix} L(\gamma) \\ L(\beta\gamma) \\ \ldots \\ L(\beta^{\mu-1}\gamma) \end{bmatrix} \quad \text{(EQ 5)}$$

Then, the matrix, $I_\lambda(\gamma)$, is the matrix that is obtained by cyclic shifting the $i_0$ position of the μ×μ identity matrix, $I_\mu$.

To construct an LDPC code with block length, N=ρμ, and with low density parity check matrix, H, the following are found:

1. A location set, $LS = \{\alpha^{i_0}, \ldots, \alpha^{i_{\rho-1}}\}$, and a second non-zero elements set, $V = \{v_0, v_1, \ldots, v_{\rho-1}\} \subseteq GF^*(q)$, that include ρ non-zero elements $v_0, v_1, \ldots, v_{\rho-1}$ are both selected from the modified Galois field, GF*(q), which can also be referred to as a first non-zero elements set of a Galois field, GF*(q), that includes a predetermined finite number of non-zero elements. That is to say, each of the location set, LS, and the second non-zero elements set, V, is either a corresponding subset of the first non-zero elements set of the Galois field, GF*(q). Either of the location set, LS, and the second non-zero elements set, V, can include the entire first non-zero elements set of the Galois field, GF*(q).

Figure 10:
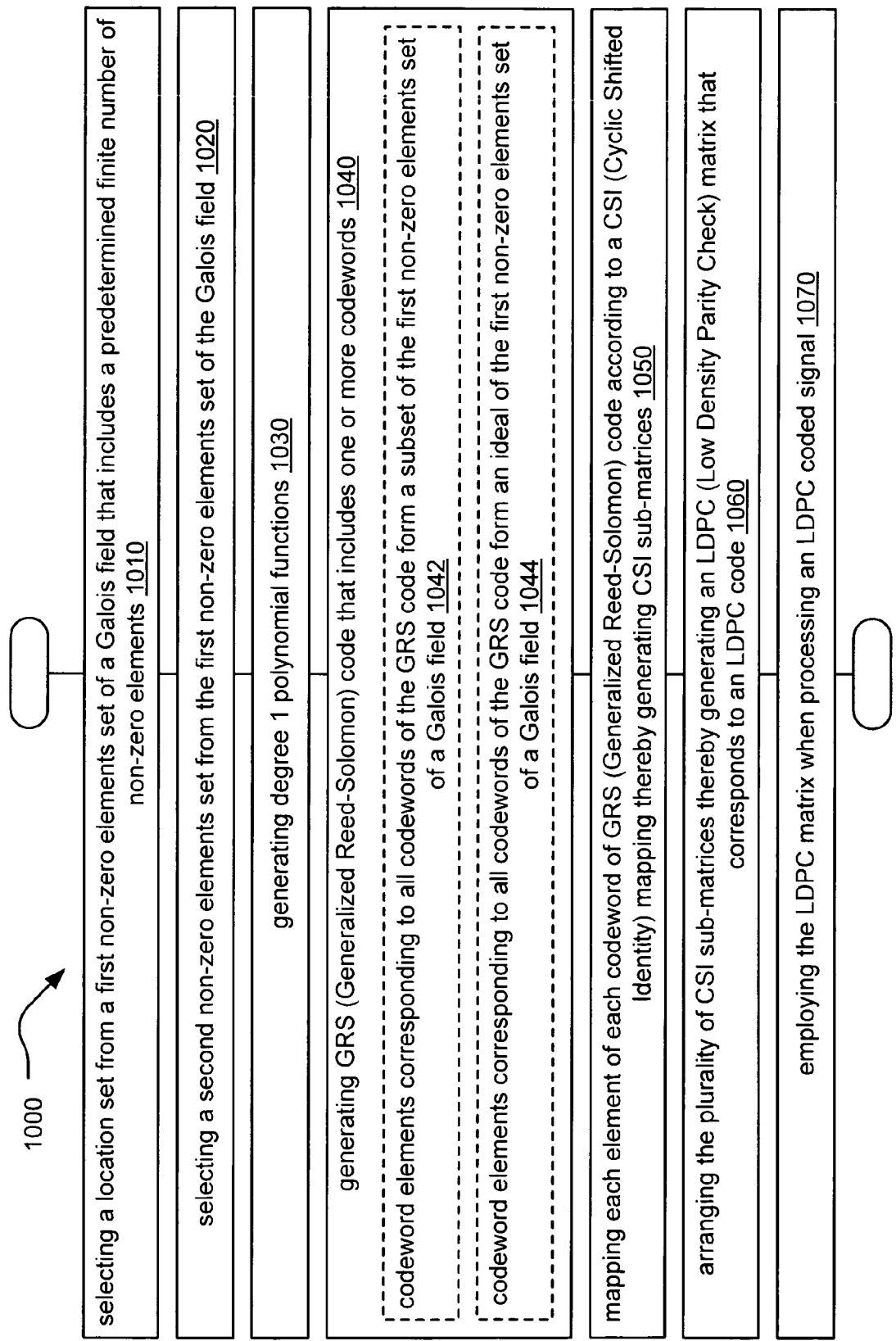
FIG. 10 illustrates an alternative embodiment of a method for constructing a parity check matrix corresponding to a regular or an irregular LDPC code.

FIG. 10 illustrates an alternative embodiment of a method for constructing a parity check matrix corresponding to a regular or an irregular LDPC code. Referring to method 1000 of the FIG. 10, the method 1000 involves selecting a location set from a first non-zero elements set of a Galois field that includes a predetermined finite number of non-zero elements, as shown in a block 1010. This first non-zero elements set of the Galois field, GF*(q), can be viewed as being a modified Galois field includes one less element (i.e., no all 0 valued element) than an original Galois field. It does not include the "all zero" valued vector therein. The method 1000 then continues by selecting a second non-zero elements set from the first non-zero elements set of the Galois field, GF*(q), as shown in a block 1020.

2. Then, a plurality of degree 1 polynomial functions, $f_i$, (i.e., θ linear functions) is generated. The method 1000 involves generating a number of degree 1 polynomial functions, as shown in a block 1030. Each of these degree 1 polynomial function is a function of one corresponding coefficient of a number of coefficients and one constant of a number of constants. The number of coefficients and the number of constants are determined by the location set and the second non-zero elements set. Several embodiments above describe and show possible means by which these values may be determined based on some constraints set forth by a designer. For example, the constraints set forth in the design of the LDPC code determine the structure of the LDPC code. Moreover, each degree 1 polynomial function of the number of degree 1 polynomial functions is a non-scalar multiple of every other 1 polynomial function of the number of degree 1 polynomial functions.

These polynomial functions can be represented as follows:

$$f_i(x) = a_i x + b_i, \text{ where } a_i, b_i \in GF(q) \text{ and } i = 0, \ldots \theta-1,$$
$$\text{and such that } v_k f_i(\alpha^{i_k}) \in GF_\lambda(q), \text{ for all } i = 0, \ldots,$$
$$\theta-1, \text{ and } K = 0, \ldots, \rho-1 \quad \text{(EQ 6)}$$

It is noted that $a_i$, $b_i$, and $v_i$, must be selected above such that the constraint of (EQ 6) holds true.

The method 1000 then involves generating GRS (Generalized Reed-Solomon) code that includes one or more codewords, as shown in a block 1040. Each codeword of the GRS code includes a number of codeword elements. The multiple codeword elements corresponding to all codewords of the GRS code form a subset of the first non-zero elements set of the Galois field, GF*(q). Also, each codeword element of each codeword is a product of one element of the non-zero elements set and a resultant generated from one degree 1 polynomial function of the number of degree 1 polynomial functions evaluated at one element of the location set.

As shown in a block 1042, all of the codeword elements corresponding to all codewords of the GRS code can be viewed to form a subset of the first non-zero elements set of a Galois field, GF*(q).

As also and/or alternatively shown in a block 1044, all of the codeword elements corresponding to all codewords of the GRS code can be viewed to form an ideal of the first non-zero elements set of a Galois field, GF*(q).

As described above, it is noted that an "ideal" is a known term in the art of set theory. Generally speaking, any 2 elements selected from an ideal of a set can be multiplied together and the resultant will also be in the same ideal. Therefore, any 2 elements in the ideal, $GF_\lambda(q)$, can be multiplied together and the resultant will also be in the same ideal, $GF_\lambda(q)$. It also follows that an "ideal" of a set is also generally a "subset" of that set as well.

According to this, when considering a 2-D GRS code, the codewords of a 2-D GRS code, $C_{GRS}$, can be generated as follows:

$$c_i = (c_{i,0}, \ldots, c_{i,\rho-1}) = (v_0 \cdot f_i(\alpha^{i_0}), \ldots, v_{\rho-1} \cdot f_i(\alpha^{i_{\rho-1}})),$$
$$\text{for } i=0, \ldots, \theta-1.$$

As can be seen, each codeword of the GRS, $C_{GRS}$, code includes a number of elements, $c_{i,j}$. Moreover, each codeword element, $c_{i,j}$, is a product of one element of the non-zero elements set, V (e.g., $v_i$), and one degree 1 polynomial that is evaluated at one element of the location set, L (e.g., $f_i(\alpha^{i_j})$).

As shown in a block 1050, the method 1000 then involves mapping each element of each codeword of the GRS code according to a CSI (Cyclic Shifted Identity) mapping thereby generating CSI sub-matrices. The method 1000 then involves arranging the CSI sub-matrices thereby generating an LDPC matrix that corresponds to an LDPC code, as shown in a block 1060.

From this, a low density parity check matrix, $H(C_{GRS})$, being a function of the GRS code, $C_{GRS}$, can be defined as follows:

$$H(C_{GRS}) = \begin{bmatrix} I_\lambda(c_{0,0}) & I_\lambda(c_{0,1}) & \cdots & I_\lambda(c_{0,\rho-1}) \\ I_\lambda(c_{1,0}) & I_\lambda(c_{1,1}) & \cdots & I_\lambda(c_{1,\rho-1}) \\ \vdots & \vdots & \ddots & \vdots \\ I_\lambda(c_{\theta-1,0}) & I_\lambda(c_{\theta-1,1}) & \cdots & I_\lambda(c_{\theta-1,\rho-1}) \end{bmatrix} \quad (EQ\ 7)$$

This low density parity check matrix, $H(C_{GRS})$, is a $[\mu \cdot \theta] \times [\mu \cdot \rho]$ matrix. Each of the sub-matrices thereof is a $\mu \times \mu$ CSI sub-matrix.

When $\lambda > 1$, then $\mu = (q-1)/\lambda$. An LDPC code is then constructed having the low density parity check matrix, $H(C_{GRS})$.

As also mentioned above, when one has such a low density parity check matrix, $H(C_{GRS})$, one has all of the information necessary to implement the LDPC code within a communication system or communication device. That is to say, when a low density parity check matrix, H, is available for use in decoding processing at a receiving end of a communication channel, the corresponding generator matrix, G, of the LDPC code may be generated straightforwardly from the low density parity check matrix, H. Having this information allows a designer to implement the encoding processing (using the generator matrix, G, of the LDPC code) at the transmitter end of the communication channel and also to decoding processing (using the low density parity check matrix, H, of the LDPC code) at the receiver end of the communication channel. In fact, it is common in the art that an LDPC code is defined directly from the low density parity check matrix, H. Stated another way, the low density parity check matrix, H, includes all of the necessary information to define the LDPC code.

The method 1000 then involves employing the LDPC matrix when processing an LDPC coded signal, as shown in a block 1070. This processing of an LDPC coded signal can involve encoding of information bits to generate an LDPC coded signal and/or decoding of an LDPC coded signal to make best estimates of the information bits encoded therein.

If desired, in order to achieve both near capacity (or Shannon limit) and a lower error floor, the regular LDPC constructed by the low density parity check matrix, $H(C_{GRS})$, being a regular LDPC code, may be modified to an irregular LDPC code by replacing some of CSI sub-matrices, $I_\lambda(c)$, with all zero-valued matrices (e.g., matrices with all zero elements). Alternatively, rather than puncture an entire CSI sub-matrix, only selected elements of certain of the CSI sub-matrices, $I_\lambda(c)$, can be punctured (i.e., replaced with 0s).

For the irregular LDPC codes, the condition of (EQ 6) depicted above can be changed to:

$v_j f_i(\alpha^{i_j}) \in GF^\lambda(q)$, if the sub-matrix in the position (i,j) is not an all zero-valued matrix (i.e., all elements being value 0). To generate irregular LDPC codes with Class 1, Class 2, Class 3, and Class 4 depicted above, a designer needs first to find the plurality of degree 1 polynomial functions, $f_i$, (i.e., $\theta$ linear functions) that satisfy the conditions of those respective classes. These conditions are described in more detail in the U.S. Utility patent application Ser. No. 11/292,135, entitled "Algebraic construction of LDPC (Low Density Parity Check) codes with corresponding parity check matrix having CSI (Cyclic Shifted Identity) sub-matrices."

Example:

Let q=163 which is a prime number, and let $\lambda=2$. Then $\mu=(q-1)/\lambda=81$. Let $\alpha=2$. Then $GF(162)=\langle\alpha\rangle$. Let $\beta=\alpha^2$. To construct a rate 5/6 LDPC code with low density parity check matrix, H, having Class 4 (as described above) and with block length N=24×81=1944 and N−K=24×4=96, one finds $\{i_0, i_1, \ldots, i_{23}\}$ can be as follows:

{9,96,56,95,128,65,80,40,145,3,51,153,62,69,76,106, 33,52,111,71,26,87,68,4}.

Then, the location set, $L=\{\alpha^{i_0}, \ldots, \alpha^{i_{\rho-1}}\}$, and the non-zero elements set, $V=\{v_0, v_1, \ldots, v_{\rho-1}\} \subseteq GF^*(q)$, that include $\rho$ non-zero elements $v_0, v_1, \ldots, v_{\rho-1}$ that are both selected from the modified Galois field, GF*(q), are as follows:

1. location set, $L=\{\alpha^{i_0}, \ldots, \alpha^{i_{23}}\}$
2. non-zero elements set, $\{v_0, v_1, \ldots, v_{23}\}=\{\alpha^{k_0}, \ldots, \alpha^{k_{23}}\}$, such that $\{k_0, k_1, \ldots, k_{23}\}$ is equal to:

{30,108,9,79,157,114,70,78,38,6,148,105,142,132,41, 106,5,28,85,21,32,33,10,24}.

Finally, there are 4 degree 1 polynomial functions, $f_0, f_1, f_2, f_3$, (i.e., 4 linear functions) as shown below.

$f_0=\alpha^{130}x+\alpha^{85}, f_1=\alpha^{41}x+\alpha^{128}, f_2=\alpha^{158}x+\alpha^{122},$
$f_3=\alpha^{77}x+\alpha^{106}.$ One can verify the following:

$v_j f_i(\alpha^{i_j}) \in GF^2(q)=\{\beta, \ldots, \beta^{81}\}$ for (i, j)∉{(0, 21), (0, 22), (1, 22), (1, 23), (2, 19), (2, 20), (3, 20), (3, 21)}. The Final low density parity check matrix, H, includes a number of 81×81 sub-matrices.

The convention employed to depict this Final low density parity check matrix, H, corresponding to a Class 4 LDPC code, code rate 5/6, block length 1944, is presented below. The table consists of a plurality of entries such that every entry represents a 81×81 sub-matrix, where an actual number in the entry location indicates the shift position that is used to construct the CSI sub-matrix (e.g., right cyclic shifting of the identity matrix by that number of positions), and an empty spaces indicates an all zero-valued (i.e., all elements are 0) 81×81 sub-matrix. This table, representing the LDPC code described above, is provided using 2 paragraphs because of its size. The table includes 4 rows and 24 columns. For this LDPC code, the first table portion depicts rows 1-4 and columns 1-12, and the second table portion depicts rows 1-4 and columns 13-24.

Example

Final H matrix, LDPC Code 81-0: Block size 1944, 81×81 sub-matrices

| Rows 1-4, Columns 1-12 | | | | | | | | | | | |
|---|---|---|---|---|---|---|---|---|---|---|---|
| 71 | 53 | 48 | 54 | 44 | 63 | 5 | 18 | 33 | 50 | 77 | 27 |
| 75 | 8 | 51 | 37 | 43 | 12 | 3 | 50 | 46 | 21 | 52 | 29 |
| 52 | 45 | 6 | 2 | 66 | 38 | 17 | 51 | 39 | 6 | 70 | 24 |
| 18 | 69 | 49 | 5 | 5 | 42 | 44 | 15 | 74 | 40 | 29 | 30 |
| Rows 1-4, Columns 13-24 | | | | | | | | | | | |
| 10 | 8 | 24 | 13 | 80 | 36 | 34 | 55 | 0 |   |   | 1 |
| 71 | 39 | 2 | 76 | 53 | 57 | 80 | 9 | 0 | 0 |   |   |
| 73 | 38 | 33 | 64 | 66 | 15 | 66 |   |   | 0 | 0 | 0 |
| 25 | 46 | 44 | 0 | 3 | 31 | 55 | 80 |   |   | 0 | 1 |

Rate 5/6 LDPC Codes Constructed using Approach 1 and Approach 2

A similar convention is employed to depict each of the LDPC codes presented below. Each table consists of a plurality of entries such that every entry represents a 81×81 (or 54×54, or 27×27, respectively as indicated) sub-matrix, where an actual number in the entry location indicates the shift position that is used to construct the CSI sub-matrix (e.g., right cyclic shifting of the identity matrix by that number of positions), and an empty spaces indicates an all zero-valued (i.e., all elements are 0) 81×81 (or 54×54, or 27×27, respectively as indicated) sub-matrix. Each of these tables, representing the various LDPC codes, is provided using 2 paragraphs because of their size. Each table includes 4 rows and 24 columns. For each corresponding code, the first table portion depicts rows 1-4 and columns 1-12, and the second table portion depicts rows 1-4 and columns 13-24

LDPC Codes Having: Block Size 1944, and Sub-Matrices of Size: 81×81

LDPC Code 81-1: Block size 1944, 81×81 sub-matrices

| Rows 1-4, Columns 1-12 | | | | | | | | | | | |
|---|---|---|---|---|---|---|---|---|---|---|---|
| 65 | 52 | 19 | 41 | 2 | 0 | 31 | 23 | 8 | 61 | 63 | 73 |
| 10 | 27 | 80 | 39 | 1 | 69 | 9 | 13 | 51 | 22 | 67 | 5 |
| 76 | 29 | 27 | 9 | 15 | 74 | 41 | 66 | 6 | 15 | 24 | 55 |
| 45 | 55 | 42 | 32 | 80 | 45 | 19 | 62 | 50 | 75 | 31 | 75 |
| Rows 1-4, Columns 13-24 | | | | | | | | | | | |
| 43 | 80 | 54 | 79 | 22 | 57 | 4 | 41 | 1 | 0 |   |   |
| 57 | 31 | 19 | 13 | 79 | 79 | 49 | 78 |   | 0 | 0 |   |
| 22 | 71 | 17 | 55 | 59 | 42 | 73 |   |   |   | 0 | 0 |
| 44 | 37 | 2 | 24 | 69 | 37 | 45 | 51 | 1 |   |   | 0 |

LDPC Code 81-2: Block Size 1944, 81×81 Sub-Matrices

| Rows 1-4, Columns 1-12 | | | | | | | | | | | |
|---|---|---|---|---|---|---|---|---|---|---|---|
| 76 | 30 | 55 | 75 | 59 | 77 | 53 | 45 | 20 | 52 | 51 | 75 |
| 17 | 17 | 5 | 36 | 5 | 66 | 45 | 3 | 41 | 33 | 24 | 38 |
| 28 | 10 | 49 | 68 | 8 | 75 | 0 | 79 | 72 | 18 | 11 | 2 |
| 70 | 79 | 35 | 24 | 63 | 9 | 24 | 69 | 79 | 35 | 23 | 36 |
| Rows 1-4, Columns 13-24 | | | | | | | | | | | |
| 44 | 51 | 53 | 55 | 48 |   | 41 | 3 | 1 | 0 |   |   |
| 20 | 3 | 17 | 34 | 36 | 54 | 0 |   |   | 0 | 0 |   |
| 49 | 30 | 22 | 56 | -1 | 74 | 58 | 17 | 0 |   | 0 | 0 |
| 0 | 44 | 50 | 20 | 11 | 80 |   | 76 | 1 |   |   | 0 |

LDPC Code 81-3: Block Size 1944, 81×81 Sub-Matrices

| Rows 1-4, Columns 1-12 | | | | | | | | | | | |
|---|---|---|---|---|---|---|---|---|---|---|---|
| 48 | 60 | 73 | 61 | 32 | 10 | 10 | 34 | 20 | 15 | 39 | 7 |
| 10 | 36 | 52 | 17 | 3 | 17 | 9 | 53 | 42 | 47 | 47 | 63 |
| 36 | 69 | 60 | 66 | 12 | 1 | 6 | 8 | 15 | 43 | 61 | 42 |
| 70 | 79 | 44 | 69 | 80 | 49 | 72 | 7 | 47 | 66 | 77 | 32 |
| Rows 1-4, Columns 13-24 | | | | | | | | | | | |
| 32 | 4 | 62 | 68 | 17 |   | 46 | 3 | 1 | 0 |   |   |
| 76 | 31 | 47 | 71 | 57 | 54 | 63 |   |   | 0 | 0 |   |
| 46 | 6 | 5 | 7 |   | 21 | 12 | 14 | 0 |   | 0 | 0 |
| 55 | 21 | 59 | 15 | 78 | 0 |   | 76 | 1 |   |   | 0 |

LDPC Code 81-4: Block Size 1944, 81×81 Sub-Matrices

| Rows 1-4, Columns 1-12 | | | | | | | | | | | |
|---|---|---|---|---|---|---|---|---|---|---|---|
| 38 | 76 | 58 | 16 | 2 | 78 | 30 | 10 | 5 | 54 | 45 | 1 |
| 53 | 43 | 41 | 47 | 32 | 11 | 11 | 20 | 40 | 16 | 61 | 76 |
| 57 | 29 | 66 | 80 | 29 | 18 | 54 | 67 | 25 | 29 | 10 | 6 |
| 41 | 73 | 65 | 12 | 69 | 22 | 60 | 74 | 18 | 39 | 7 | 61 |
| Rows 1-4, Columns 13-24 | | | | | | | | | | | |
| 79 | 71 | 57 | 27 | 61 |   | 23 | 60 | 1 | 0 |   |   |
| 1 | 30 | 23 | 14 | 36 | 59 | 45 |   |   | 0 | 0 |   |
| 61 | 80 | 19 | 78 |   | 62 | 55 | 15 | 0 |   | 0 | 0 |
| 9 | 69 | 9 | 74 | 71 | 0 |   | 29 | 1 |   |   | 0 |

LDPC Code 81-5: Block Size 1944, 81×81 Sub-Matrices

| Rows 1-4, Columns 1-12 | | | | | | | | | | | |
|---|---|---|---|---|---|---|---|---|---|---|---|
| 22 | 66 | 10 | 63 | 41 | 43 | 73 | 6 | 18 | 57 | 30 | 44 |
| 76 | 57 | 47 | 51 | 48 | 75 | 5 | 56 | 60 | 38 | 38 | 15 |
| 37 | 53 | 34 | 17 | 15 | 25 | 22 | 32 | 38 | 36 | 30 | 37 |
| 15 | 2 | 30 | 54 | 62 | 13 | 4 | 48 | 67 | 10 | 61 | 72 |
| Rows 1-4, Columns 13-24 | | | | | | | | | | | |
| 27 | 16 | 69 |   | 16 | 41 |   | 56 | 1 | 0 |   |   |
| 74 | 14 |   | 35 | 55 | 1 | 21 | 19 |   | 0 | 0 |   |
| 18 | 30 | 41 | 56 | 57 |   | 11 |   |   |   | 0 | 0 |
| 33 | 41 | 36 | 2 |   | 25 | 37 | 7 | 1 |   |   | 0 |

LDPC Code 81-6: Block Size 1944, 81×81 Sub-Matrices

| Rows 1-4, Columns 1-12 | | | | | | | | | | | |
|---|---|---|---|---|---|---|---|---|---|---|---|
| 56 | 73 | 17 | 57 | 2 | 71 | 71 | 41 | 68 | 39 | 11 | 17 |
| 80 | 78 | 58 | 26 | 74 | 2 | 65 | 58 | 71 | 50 | 36 | 1 |

-continued

| 56 | 63 | 55 | 3  | 34 | 75 | 29 | 53 | 62 | 5  | 37 | 48 |
| 63 | 60 | 16 | 32 | 17 | 9  | 33 | 73 | 16 | 50 | 56 | 76 |

Rows 1-4, Columns 13-24

| 18 | 62 | 1  |    | 27 | 27 | 17 | 9  | 1  | 0  |   |   |
| 64 | 18 | 55 | 56 | 75 |    | 49 | 10 |    | 0  | 0 |   |
| 48 | 40 | 9  | 64 | 34 | 78 |    |    | 0  |    | 0 | 0 |
| 41 | 2  | 58 | 6  |    | 23 | 63 | 11 | 1  |    |   | 0 |

LDPC Codes Having: Block Size 1296, and Sub-Matrices of Size: 54×54

LDPC Code 54-1: Block Size 1296, 54×54 Sub-Matrices

Rows 1-4, Columns 1-12

| 48 | 29 | 37 | 52 | 2  | 16 | 6  | 14 | 53 | 31 | 34 | 5  |
| 17 | 4  | 30 | 7  | 43 | 11 | 24 | 6  | 14 | 21 | 6  | 39 |
| 7  | 2  | 51 | 31 | 46 | 23 | 16 | 11 | 53 | 40 | 10 | 7  |
| 19 | 48 | 41 | 1  | 10 | 7  | 36 | 47 | 5  | 29 | 52 | 52 |

Rows 1-4, Columns 13-24

| 18 | 42 | 53 | 31 | 45 |    | 46 | 52 | 1  | 0  |   |   |
| 17 | 40 | 47 | 7  | 15 | 41 | 19 |    |    | 0  | 0 |   |
| 46 | 53 | 33 | 35 |    | 25 | 35 | 38 | 0  |    | 0 | 0 |
| 31 | 10 | 26 | 6  | 3  | 2  |    | 51 | 1  |    |   | 0 |

LDPC Code 54-2: Block Size 1296, 54×54 Sub-Matrices

Rows 1-4, Columns 1-12

| 27 | 11 | 17 | 13 | 6  | 38 | 21 | 45 | 37 | 39 | 10 | 0  |
| 33 | 25 | 7  | 15 | 32 | 19 | 39 | 31 | 0  | 46 | 31 | 12 |
| 37 | 23 | 43 | 1  | 11 | 4  | 17 | 51 | 24 | 10 | 33 | 24 |
| 34 | 4  | 21 | 43 | 47 | 17 | 23 | 23 | 19 | 35 | 44 | 29 |

Rows 1-4, Columns 13-24

| 23 | 0  | 4  | 5  | 39 | 10 | 30 | 50 | 1  | 0  |   |   |
| 6  | 19 | 3  | 44 | 42 | 7  | 46 | 9  |    | 0  | 0 |   |
| 50 | 16 | 32 | 20 | 2  | 29 | 23 |    | 0  |    | 0 | 0 |
| 26 | 26 | 50 | 13 | 25 | 25 | 52 | 44 | 1  |    |   | 0 |

LDPC Code 54-3: Block Size 1296, 54×54 Sub-Matrices

Rows 1-4, Columns 1-12

| 13 | 6  | 53 | 28 | 40 | 13 | 22 | 22 | 33 | 5  | 4  | 12 |
| 29 | 43 | 22 | 48 | 12 | 3  | 43 | 50 | 37 | 51 | 26 | 19 |
| 18 | 27 | 28 | 2  | 51 | 51 | 15 | 32 | 14 | 0  | 38 | 49 |
| 16 | 46 | 11 | 20 | 35 | 32 | 43 | 24 | 50 | 2  | 35 | 26 |

Rows 1-4, Columns 13-24

| 35 | 49 | 5  | 32 | 52 | -1 | 39 | 47 | 1  | 0  |   |   |
| 19 | 31 | 47 | 26 | 17 | 40 | 16 |    |    | 0  | 0 |   |
| 42 | 4  | 6  | 51 | -1 | 35 | 30 | 51 | 0  |    | 0 | 0 |
| 20 | 29 | 11 | 47 | 2  | 44 | -1 | 45 | 1  |    |   | 0 |

LDPC Codes Having: Block Size 648, and Sub-Matrices of Size: 27×27

LDPC Code 27-1: Block Size 648, 27×27 Sub-Matrices

Rows 1-4, Columns 1-12

| 3  | 14 | 7  | 20 | 6  | 2  | 7  | 21 | 11 | 11 | 14 | 1 |
| 12 | 4  | 25 | 22 | 0  | 25 | 26 | 26 | 12 | 10 | 22 | 7 |

| 18 | 16 | 26 | 21 | 4  | 7  | 2  | 15 | 23 | 1  | 24 | 17 |
| 22 | 7  | 9  | 11 | 9  | 3  | 21 | 0  | 9  | 0  | 8  | 5  |

Rows 1-4, Columns 13-24

| 10 | 2  | 23 | 10 | 23 |    | 11 | 21 | 1  | 0  |   |   |
| 25 | 18 | 0  | 7  | 6  | 15 | 23 |    |    | 0  | 0 |   |
| 19 | 5  | 23 | 24 |    | 12 | 18 | 7  | 0  |    | 0 | 0 |
| 21 | 25 | 4  | 22 | 5  | 6  |    | 4  | 1  |    |   | 0 |

LDPC Code 27-2: Block Size 648, 27×27 Sub-Matrices

Rows 1-4, Columns 1-12

| 12 | 17 | 8  | 9  | 1  | 8  | 0  | 18 | 15 | 2  | 24 | 10 |
| 10 | 8  | 0  | 8  | 12 | 2  | 3  | 0  | 5  | 25 | 21 | 26 |
| 8  | 9  | 21 | 25 | 18 | 15 | 25 | 15 | 16 | 10 | 18 | 19 |
| 19 | 16 | 10 | 1  | 9  | 19 | 22 | 5  | 3  | 19 | 20 | 15 |

Rows 1-4, Columns 13-24

| 2  | 26 | 22 | 1  | 26 |    | 23 | 15 | 1  | 0  |   |   |
| 3  | 5  | 5  | 21 | 4  | 20 | 0  |    |    | 0  | 0 |   |
| 13 | 4  | 9  | 3  |    | 12 | 2  | 15 | 0  |    | 0 | 0 |
| 6  | 17 | 7  | 25 | 15 | 20 |    | 21 | 1  |    |   | 0 |

LDPC Code 27-3: Block Size 648, 27×27 Sub-Matrices

Rows 1-4, Columns 1-12

| 1  | 10 | 1  | 5  | 9  | 26 | 19 | 17 | 19 | 23 | 12 | 11 |
| 15 | 26 | 7  | 16 | 12 | 14 | 12 | 26 | 10 | 3  | 7  | 8  |
| 7  | 5  | 10 | 21 | 3  | 9  | 19 | 1  | 9  | 20 | 0  | 9  |
| 23 | 22 | 14 | 6  | 26 | 24 | 21 | 21 | 7  | 15 | 26 | 19 |

Rows 1-4, Columns 13-24

| 5  | 3  | 16 | 9  | 13 |    | 10 | 5  | 1  | 0  |   |   |
| 3  | 20 | 17 | 8  | 25 | 7  | 12 |    |    | 0  | 0 |   |
| 17 | 8  | 3  | 12 |    | 1  | 1  | 1  | 0  |    | 0 | 0 |
| 23 | 19 | 21 | 6  | 16 | 10 |    | 25 | 1  |    |   | 0 |

Figure 11:
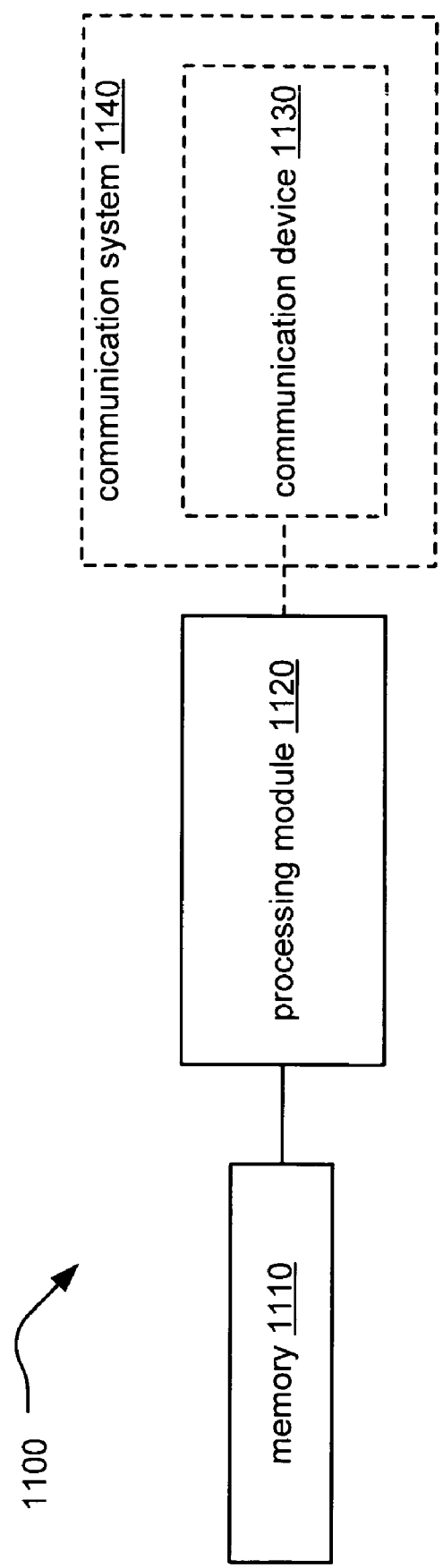
FIG. 11 illustrates an embodiment of an apparatus that is operable to construct at least one parity check matrix corresponding to at least one LDPC code using shortening and puncturing.

FIG. 11 illustrates an embodiment of an apparatus 1100 that is operable to construct at least one parity check matrix corresponding to at least one LDPC code. The apparatus 1100 includes a processing module 1120, and a memory 1110. The memory 1110 is coupled to the processing module, and the memory 1110 is operable to store operational instructions that enable the processing module 1120 to perform a variety of functions. The processing module 1120 is operable to perform the appropriate processing to generate at least one LDPC matrix corresponding to at least one LDPC code using any of the approach presented herein.

The processing module 1120 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1110 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1120 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the parity check matrix of the LDPC code can be provided from the apparatus 1100 to a communication system 1140 that is operable to employ and perform error correcting coding using that LDPC code. The parity check matrix of the LDPC code can also be provided from the apparatus 1100 to any of a variety of communication devices 1130 implemented within the communication system 1140 as well. This way, a completely integrated means is provided by which the parity check matrix of the LDPC code can be constructed in hardware and provided to one or more the communication devices 1130 implemented within a communication system 1140 to employ that LDPC code. If desired, the apparatus 1120 can be designed to generate multiple parity check matrices corresponding to multiple LDPC codes as well. In some embodiments, the apparatus 1120 can selectively provide different information (corresponding to different LDPC codes) to different communication devices and/or communication systems. That way, different communication links between different communication devices can employ different error correcting coding. Clearly, the apparatus 1120 can also provide the same information (corresponding to a singular LDPC code) to each of different communication devices and/or communication systems as well without departing from the scope and spirit of the invention.

Figure 12:
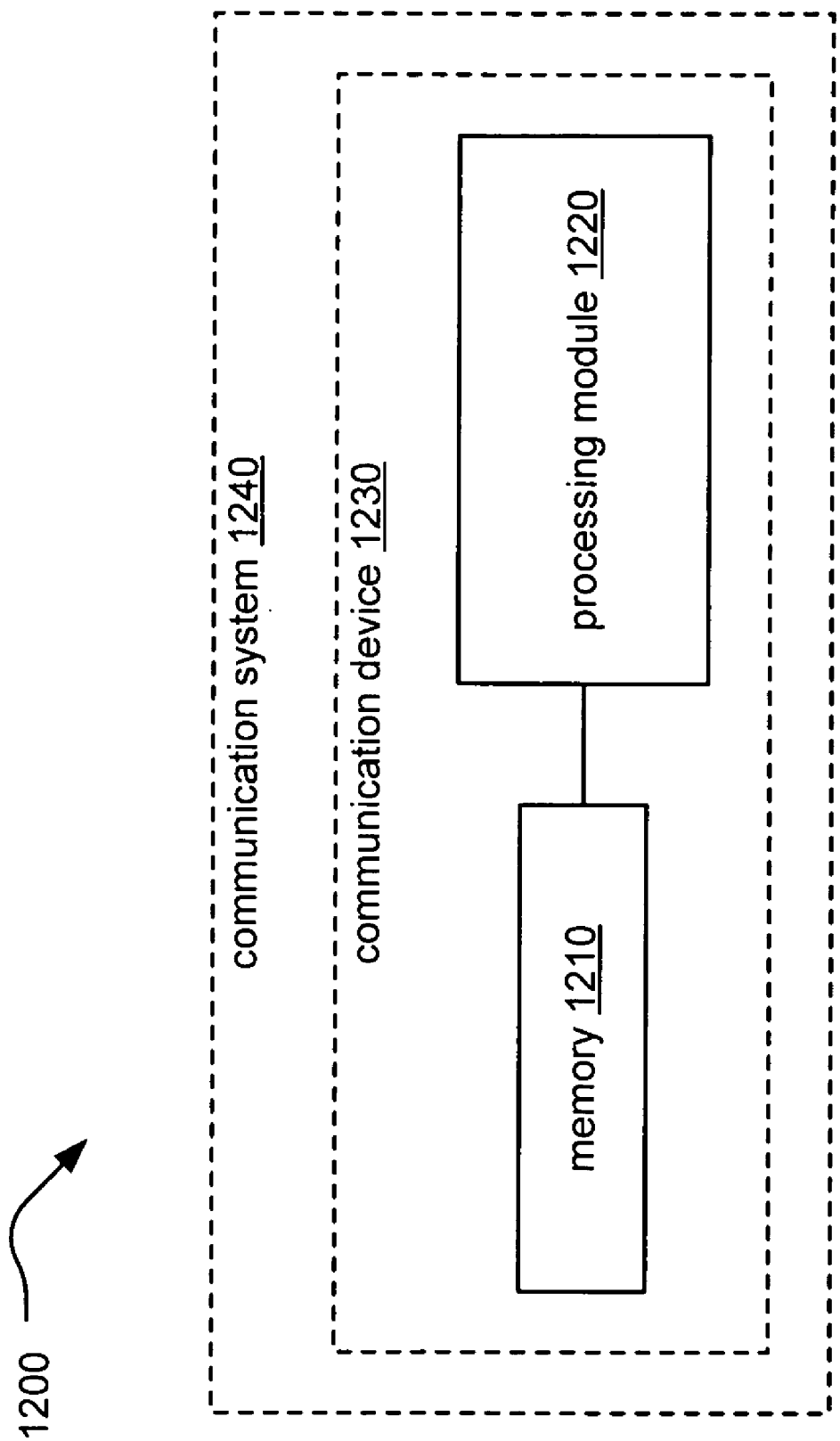
FIG. 12 illustrates an alternative embodiment of an apparatus that is operable to construct at least one parity check matrix corresponding to at least one LDPC code.

FIG. 12 illustrates an alternative embodiment of an apparatus 1200 that is operable to construct at least one parity check matrix corresponding to at least one LDPC code. The apparatus 1200 includes a processing module 1220, and a memory 1210. The memory 1210 is coupled to the processing module, and the memory 1210 is operable to store operational instructions that enable the processing module 1220 to perform a variety of functions. The processing module 1220 (serviced by the memory 1220) can be implemented as an apparatus capable to perform any of the functionality of any of the various modules and/or functional blocks described herein. For example, the processing module 1220 (serviced by the memory 1220) can be implemented as an apparatus capable to perform LDPC code construction and processing of an LDPC coded signal using any of the various embodiments described herein. The processing module 1220 is operable to perform the appropriate processing to generate at least one LDPC matrix corresponding to at least one LDPC code using any of the approach presented herein.

The processing module 1220 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1210 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1220 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1200 can be any of a variety of communication devices 1230, or any part or portion of any such communication device 1230. Any such communication device that includes the apparatus 1200 can be implemented within any of a variety of communication systems 1240 as well.

It is also noted that various embodiments of LDPC code construction and/or LDPC coded signal processing presented herein, and equivalents thereof, may be applied to many types of communication systems and/or communication devices. Some additional types of communication systems and some of the communication devices therein that can employ various embodiments of LDPC code construction and/or LDPC coded signal processing are presented and described below.

Figure 13A:
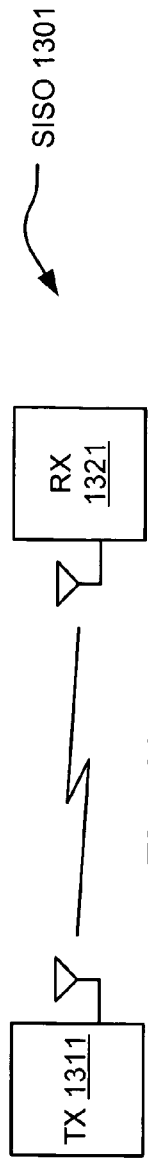
FIG. 13A is a diagram illustrating an embodiment of a single-input-single-output (SISO) communication system.

FIG. 13A is a diagram illustrating an embodiment of a single-input-single-output (SISO) communication system 1301. A transmitter (TX 1311) having a single transmit antenna communicates with a receiver (RX 1321) having a single receive antenna.

Figure 13B:
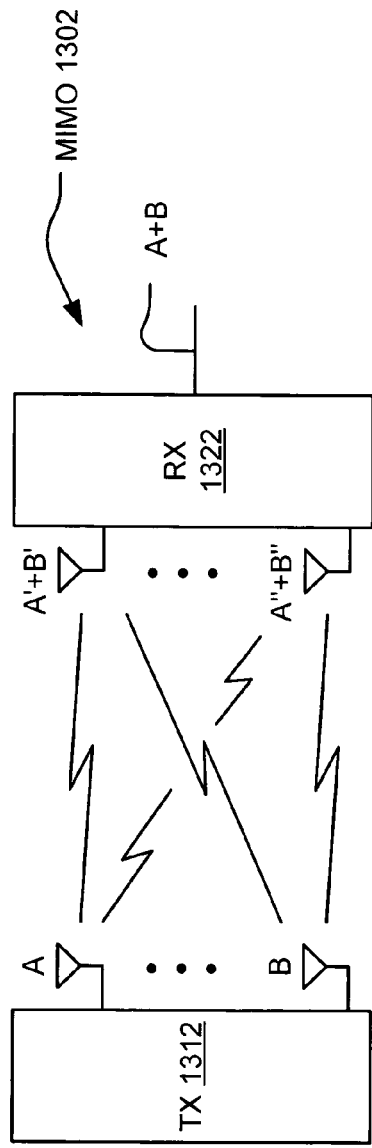
FIG. 13B is a diagram illustrating an embodiment of a multiple-input-multiple-output (MIMO) communication system.

FIG. 13B is a diagram illustrating an embodiment of a multiple-input-multiple-output (MIMO) communication system 1302. A transmitter (TX 1312) having multiple transmit antennae communicates with a receiver (RX 1322) having multiple receive antennae. Looking only at 2 of the plurality of antennae at either end of the communication channel, a first antenna transmits A and a second antenna transmits B. At the RX 1322, a first antenna receives A'+B' and a second antenna receives A"+B". The RX 1322 includes the appropriate functionality to perform the extraction and generation of a signal that is a best estimate of the transmitted signal A and B.

Figure 13D:
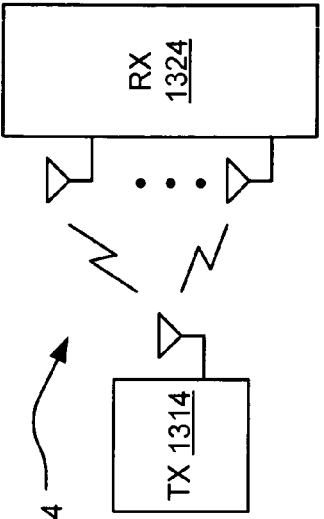
FIG. 13D is a diagram illustrating an embodiment of a single-input-multiple-output (SIMO) communication system.
Figure 13C:
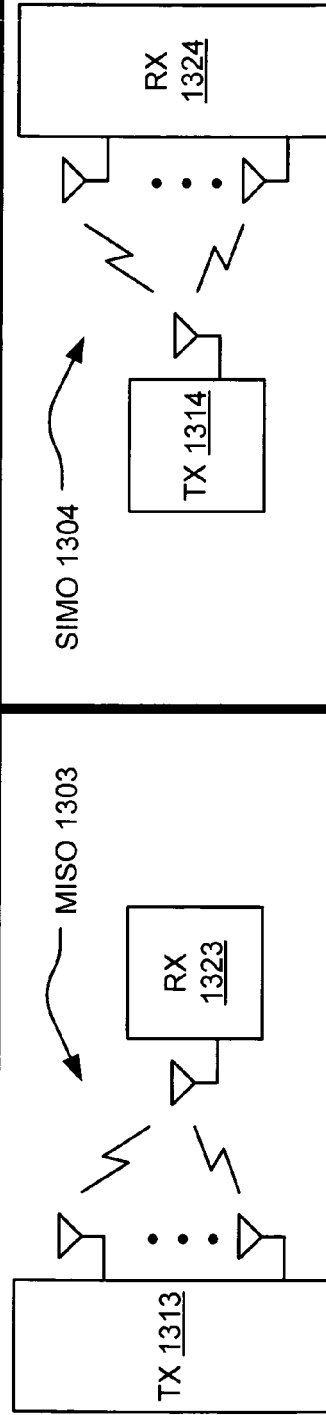
FIG. 13C is a diagram illustrating an embodiment of a multiple-input-single-output (MISO) communication system.

FIG. 13C is a diagram illustrating an embodiment of a multiple-input-single-output (MISO) communication system 1303. A transmitter (TX 1313) having multiple transmit antennae communicates with a receiver (RX 1323) having a single receive antenna.

FIG. 13D is a diagram illustrating an embodiment of a single-input-multiple-output (SIMO) communication system 1304. A transmitter (TX 1314) having a single transmit antenna communicates with a receiver (RX 1324) having multiple receive antennae. A single-input-multiple-output (SIMO) communication system 1304 can be viewed as being the dual of a MISO communication system.

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:
1. A method, comprising:
   generating GRS (Generalized Reed-Solomon) code that includes a plurality of codewords, wherein:
      each codeword of the GRS code includes a plurality of codeword elements;
      the pluralities of codeword elements corresponding to all codewords of the GRS code form a subset of a first non-zero elements set of a Galois field that includes a predetermined finite number of non-zero elements; and each codeword element of each codeword of the plurality of codewords is a product of one element of a second non-zero elements set and a resultant generated from one degree 1 polynomial function of the plurality of degree 1 polynomial functions evaluated at one element of the location set;

mapping each element of each codeword of the plurality of codewords of the GRS code according to a CSI (Cyclic Shifted Identity) mapping thereby generating a plurality of CSI sub-matrices;

arranging the plurality of CSI sub-matrices thereby generating a LDPC (Low Density Parity Check) matrix that corresponds to an LDPC code; and employing the LDPC matrix when processing an LDPC coded signal.

2. The method of claim 1, the employing the LDPC matrix when processing an LDPC coded signal comprising:
forming a generator matrix that corresponds to the LDPC matrix; and
encoding at least one information bit using either the LDPC matrix or a generator matrix that corresponds to the LDPC matrix thereby generating the LDPC coded signal.

3. The method of claim 1, the employing the LDPC matrix when processing an LDPC coded signal comprising:
encoding at least one information bit using the LDPC matrix thereby generating the LDPC coded signal.

4. The method of claim 1, the employing the LDPC matrix when processing an LDPC coded signal comprising:
decoding the LDPC coded signal using the LDPC matrix thereby generating a best estimate of at least one information bit encoded therein.

5. The method of claim 1, wherein:
the subset of the first non-zero elements set of the Galois field is an ideal of the first non-zero elements set of the Galois field.

6. The method of claim 1, further comprising:
selecting a location set from the first non-zero elements set of the Galois field;
selecting the second non-zero elements set from the first non-zero elements set of the Galois field; and
generating a plurality of degree 1 polynomial functions, wherein:
each degree 1 polynomial function is a function of one corresponding coefficient of a plurality of coefficients and one constant of a plurality of constants, wherein the plurality of coefficients and the plurality of constants are determined by the location set and the second non-zero elements set; and
each degree 1 polynomial function of the plurality of degree 1 polynomial functions is a non-scalar multiple of every other 1 polynomial function of the plurality of degree 1 polynomial functions.

7. The method of claim 1, further comprising:
puncturing at least one CSI sub-matrix of the plurality of CSI sub-matrices of the LDPC matrix thereby transforming the LDPC matrix of the LDPC code to an LDPC matrix of an irregular LDPC code.

8. The method claim 1, further comprising:
performing at least one of row permutation and column permutation to the LDPC matrix that corresponds to the LDPC code thereby arranging the LDPC matrix into a first sub-matrix that includes a first plurality of sub-matrices and a second sub-matrix that includes a second plurality of sub-matrices, wherein:
each sub-matrix of the second plurality of sub-matrixes that is situated along a diagonal of the second sub-matrix is an identity matrix;
each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix; and
each remaining sub-matrix of the second plurality of sub-matrices of the second sub-matrix is an all zero-valued sub-matrix.

9. The method claim 1, further comprising:
performing at least one of row permutation and column permutation to the LDPC matrix that corresponds to the LDPC code thereby arranging the LDPC matrix into a first sub-matrix that includes a first plurality of sub-matrices and a second sub-matrix that includes a second plurality of sub-matrices, wherein:
each sub-matrix of the second plurality of sub-matrixes that is situated along a diagonal of the second sub-matrix is an identity matrix;
each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix;
a sub-matrix of the plurality of sub-matrices situated in an upper right hand corner of the second sub-matrix is a CSI sub-matrix is generated by cyclic shifting an identity matrix by 1 position; and
each remaining sub-matrix of the second plurality of sub-matrices of the second sub-matrix is an all zero-valued sub-matrix.

10. The method claim 1, further comprising:
performing at least one of row permutation and column permutation to the LDPC matrix that corresponds to the LDPC code thereby arranging the LDPC matrix into a first sub-matrix that includes a first plurality of sub-matrices and a second sub-matrix that includes a second plurality of sub-matrices, wherein:
each sub-matrix of the second plurality of sub-matrixes that is situated along a diagonal of the second sub-matrix is an identity matrix;
each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix; and
an upper right hand sub-matrix of the second plurality of sub-matrices situated in an upper right hand corner of the second sub-matrix is a CSI sub-matrix is generated by cyclic shifting an identity matrix by I position and puncturing any non-zero element in a top row of the upper right hand sub-matrix of the second plurality of sub-matrices;
each remaining sub-matrix of the second plurality of sub-matrices of the second sub-matrix is an all zero-valued sub-matrix.

11. The method claim 1, further comprising:
performing at least one of row permutation and column permutation to the LDPC matrix that corresponds to the LDPC code thereby arranging the LDPC matrix into a first sub-matrix that includes a first plurality of sub-matrices and a second sub-matrix that includes a second plurality of sub-matrices, wherein:
- each sub-matrix of the second plurality of sub-matrixes that is situated along a diagonal of the second sub-matrix is an identity matrix;
- each sub-matrix of the second plurality of sub-matrixes having a sub-matrix along the diagonal of the second sub-matrix directly above and adjacent thereto and also having a sub-matrix along the diagonal of the second sub-matrix directly right and adjacent thereto is also an identity matrix;
- a sub-matrix of the second plurality of sub-matrices situated in an upper right hand corner of the second sub-matrix is a CSI sub-matrix is generated by cyclic shift an identity matrix by 1 position;
- a row of the second sub-matrix includes three identity sub-matrices; and
- a sub-matrix of the second plurality of sub-matrices situated in a lower right hand corner of the second sub-matrix is a CSI sub-matrix is generated by cyclic shifting an identity matrix by 1 position.

12. A method, comprising:
- selecting a location set from a first non-zero elements set of a Galois field that includes a predetermined finite number of non-zero elements;
- selecting a second non-zero elements set from the first non-zero elements set of the Galois field;
- generating a plurality of degree 1 polynomial functions, wherein:
  - each degree 1 polynomial function is a function of one corresponding coefficient of a plurality of coefficients and one constant of a plurality of constants, wherein the plurality of coefficients and the plurality of constants are determined by the location set and the second non-zero elements set; and
  - each degree 1 polynomial function of the plurality of degree 1 polynomial functions is a non-scalar multiple of every other 1 polynomial function of the plurality of degree 1 polynomial functions;
- generating GRS (Generalized Reed-Solomon) code that includes a plurality of codewords, wherein:
  - each codeword of the GRS code includes a plurality of codeword elements;
  - the pluralities of codeword elements corresponding to all codewords of the GRS code form a subset of the first non-zero elements set of a Galois field; and
  - each codeword element of each codeword of the plurality of codewords is a product of one element of the second non-zero elements set and a resultant generated from one degree 1 polynomial function of the plurality of degree 1 polynomial functions evaluated at one element of the location set;
- mapping each element of each codeword of the plurality of codewords of the GRS code according to a CSI (Cyclic Shifted Identity) mapping thereby generating a plurality of CSI sub-matrices;
- arranging the plurality of CSI sub-matrices thereby generating an LDPC (Low Density Parity Check) matrix that corresponds to an LDPC code; and
- employing the LDPC matrix when processing an LDPC coded signal.

13. The method of claim 12, wherein:
the subset of the first non-zero elements set of the Galois field is an ideal of the first non-zero elements set of the Galois field.

14. The method of claim 12, further comprising:
encoding a first information bit using the LDPC matrix thereby generating the LDPC coded signal; or
decoding the LDPC coded signal using the LDPC matrix thereby generating a best estimate of a second information bit encoded therein.

15. The method of claim 12, further comprising:
puncturing at least one CSI sub-matrix of the plurality of CSI sub-matrices of the LDPC matrix thereby transforming the LDPC of the LDPC code to an LDPC matrix of an irregular LDPC code.

16. An apparatus, comprising:
a processing module; and
a memory, coupled to the processing module, that is operable to store operational instructions that enable the processing module to:
- generate GRS (Generalized Reed-Solomon) code that includes a plurality of codewords, wherein:
  - each codeword of the GRS code includes a plurality of codeword elements;
  - the pluralities of codeword elements corresponding to all codewords of the GRS code form a subset of a first non-zero elements set of a Galois field that includes a predetermined finite number of non-zero elements; and
  - each codeword element of each codeword of the plurality of codewords is a product of one element of a second non-zero elements set and a resultant generated from one degree 1 polynomial function of the plurality of degree 1 polynomial functions evaluated at one element of the location set;
- map each element of each codeword of the plurality of codewords of the GRS code according to a CSI (Cyclic Shifted Identity) mapping thereby generating a plurality of CSI sub-matrices;
- arrange the plurality of CSI sub-matrices thereby generating a LDPC (Low Density Parity Check) matrix that corresponds to an LDPC code; and
- employ the LDPC matrix when processing an LDPC coded signal.

17. The apparatus of claim 16, wherein:
the apparatus is an encoder that is operable to encode at least one information bit using a generator matrix that corresponds to the LDPC matrix thereby generating the LDPC coded signal.

18. The apparatus of claim 16, wherein:
the apparatus is an encoder that is operable to encode at least one information bit using the LDPC matrix thereby generating the LDPC coded signal.

19. The apparatus of claim 16, wherein:
the apparatus is a decoder that is operable to decode the LDPC coded signal using the LDPC matrix thereby generating a best estimate of at least one information bit encoded therein.

20. The apparatus of claim 16, wherein:
the memory, coupled to the processing module, is operable to store operational instructions that enable the processing module to:
puncture at least one CSI sub-matrix of the plurality of CSI sub-matrices of the LDPC matrix thereby transforming the LDPC of the LDPC code to an LDPC matrix of an irregular LDPC code.

* * * * *